(12) United States Patent
Aoki

(10) Patent No.: US 8,587,987 B2
(45) Date of Patent: Nov. 19, 2013

(54) SEMICONDUCTOR MEMORY AND SYSTEM

(75) Inventor: Masaki Aoki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 82 days.

(21) Appl. No.: 13/240,492

(22) Filed: Sep. 22, 2011

(65) Prior Publication Data

US 2012/0087172 A1    Apr. 12, 2012

(30) Foreign Application Priority Data

Oct. 12, 2010   (JP) ................................ 2010-229310

(51) Int. Cl.
*G11C 11/00*   (2006.01)
*G11C 11/14*   (2006.01)
*G11C 11/15*   (2006.01)

(52) U.S. Cl.
USPC ........... 365/148; 365/158; 365/163; 365/171; 365/173

(58) Field of Classification Search
USPC ............................ 365/148, 158, 163, 171, 173
See application file for complete search history.

(56) References Cited

U.S. PATENT DOCUMENTS

| | | | |
|---|---|---|---|
| 6,829,160 B1 * | 12/2004 | Qi et al. ........................ | 365/158 |
| 6,954,373 B2 | 10/2005 | Perner | |
| 7,236,390 B1 * | 6/2007 | Chang et al. .................. | 365/151 |
| 7,848,131 B2 | 12/2010 | Kim | |
| 7,933,144 B2 | 4/2011 | Bangert et al. | |
| 2006/0098473 A1 * | 5/2006 | Yasuda ......................... | 365/148 |
| 2006/0221675 A1 * | 10/2006 | Hynes et al. .................. | 365/158 |
| 2011/0002151 A1 * | 1/2011 | Javerliac et al. ............... | 365/50 |
| 2011/0205780 A1 * | 8/2011 | Yasuda et al. ................. | 365/148 |

FOREIGN PATENT DOCUMENTS

JP       2006-526907 A       11/2006

OTHER PUBLICATIONS

Korean Office Action mailed Feb. 5, 2013 for Korean Application No. 10-2011-0103397 with English-language Translation.

* cited by examiner

*Primary Examiner* — Ly D Pham
(74) *Attorney, Agent, or Firm* — Fujitsu Patent Center

(57) ABSTRACT

A semiconductor memory includes a real memory cell including a selection transistor and a resistance variable element which are connected in series between a first voltage line and a second voltage line through a connection node, a real amplification transistor having a gate connected to the connection node, a source connected to a reference voltage line, and a drain connected to a real read line, and a sense amplifier to determine a logic held in the real memory cell by receiving a voltage of the real read line varied with a voltage generated in the connection node by resistance dividing between a source/drain resistance of the selection transistor, and the resistance variable element, the selection transistor receiving a read control voltage at the gate thereof.

18 Claims, 15 Drawing Sheets

SEMICONDUCTOR MEMORY AND SYSTEM

CROSS-REFERENCE TO RELATED APPLICATION

This application is based upon and claims the benefit of priority of the prior Japanese Patent Application No. 2010-229310, filed on Oct. 12, 2010, the entire contents of which are incorporated herein by reference.

FIELD

The embodiments discussed herein are related to a semiconductor memory and system.

BACKGROUND

Semiconductor memories having memory cells that store logics according to resistance values, which have been known in the art, and include: a spin transfer Magnetic Random Access Memory (MRAM), a Phase change Random Access Memory (PRAM), a Resistive Random Access Memory (ReRAM), and a current induced magnetic field Magnetic Random Access Memory (MRAM). In this kind of semiconductor memory, current passing through a memory cell in readout operation varies depending on a resistance value. Thus, the logic held in the memory cell is readable by detecting a current value or voltage.

As a memory cell of this kind of the semiconductor memory, for example, a memory cell having: a pair of tunnel magneto resistive (TMR) elements, in which logics opposite to each other are written; and a transistor having a gate connected to a connection node of the TMR element and a source connected to a data line has been proposed. In read operation, the transistor is turned on or off due to a current represented on a connection node depending on the resistance value of the TMR element to determine logics held in the memory cell.

An example of a related art reference includes the following document:

Japanese Laid-open Patent Publication No. 2006-526907 (corresponds to US Publication No. 2007/0164781).

To read the logic of data held in the memory cell in read operation, during the read operation, the voltage of a connection node should be generated with high accuracy depending on the logic held in the memory cell and the transistor should be turned on or off in an effective manner.

SUMMARY

According to an aspect of the embodiment, a semiconductor memory includes: a real memory cell having a selection transistor and a resistance variable element, which are connected in series between a first voltage line and a second voltage line through a connection node, and a real amplification transistor having a gate connected to the connection node, a source connected to a reference voltage line, and a drain connected to a real read line; and a sense amplifier to determine a logic held in the real memory cell by receiving a voltage of the real read line varied with a voltage generated in the connection node by resistance dividing between a source/drain resistance of the selection transistor, and the resistance variable element, the selection transistor receiving a read control voltage at the gate thereof.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

First Embodiment

In the following description, a signal line for transmitting a signal or voltage is provided with the same symbol as that of the signal's name. A transistor having an arrow directing from a gate side to a source represents a nMOS transistor. A transistor having an arrow directing from the source to the gate side is pMOS transistor.

Figure 1:
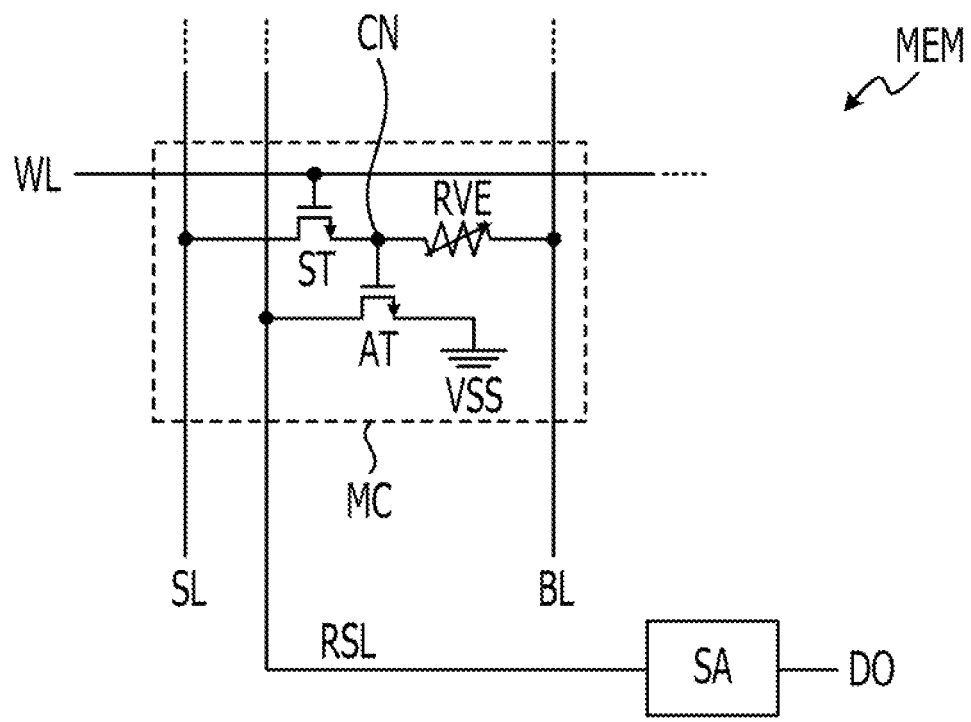
FIG. 1 is a diagram illustrating an exemplary semiconductor memory of a first embodiment.

FIG. 1 illustrates an exemplary semiconductor memory MEM of a first embodiment. For example, the semiconductor memory MEM is a magnetic random access memory (MRAM), which is a non-volatile semiconductor memory. The semiconductor memory MEM includes a real memory cell MC, which stores data, and a sense amplifier SA. The real memory cell MC includes a resistance variable element RVE and a real amplification transistor AT, which are connected in series with each other through a connection node CN, between a first voltage line SL and a second voltage like BL.

The resistance variable element RVE is set as a low resistance state or a high resistance state by the write operation.

Although it is not specifically limited, the low resistance state represents that logic 0 is held in the memory cell MC and the high resistance state represents that logic 1 is held in memory cell MC. The resistance value of the resistance variable element RVE remains constant until the write operation is restarted. This state is held even when the power supply to the semiconductor memory MEM is stopped. Thus, the memory cell MC can hold 1-bit data.

The gate of the selection transistor ST is connected to a real word line WL. In the real amplification transistor AT, a gate is connected to the connection node CN, a source is connected to a reference voltage line VSS, and a drain is connected to a real read line RSL. For example, the selection transistor ST and the real amplification transistor AT are nMOS transistors. In this example, although the reference voltage line VSS is a ground line, a voltage line in which another low-level voltage is supplied may be used.

In the read operation, the sense amplifier SA determines a logic currently held in the real memory cell MC according to the voltage of the real read line RSL, and outputs the determined logic as a data signal DO. Alternatively, in the read operation, the sense amplifier SA determines the logic currently held in the real memory cell MC according to current flowing into the real read line RSL, and outputs the determined logic as data signal DO.

In the read operation of the semiconductor memory MEM illustrated in the FIG. 1, first, a first voltage line SL is set to a first high-level voltage, and a second voltage line BL is set to a low-level voltage. Then, a word line WL is set to a read control voltage. The source/drain resistance of the selection transistor ST is decreased by the read control voltage. That is, the connection node CN is set to a voltage that provides a first voltage SL and a second voltage BL with divided voltages because of divided registers, the selection transistor ST and the resistance variable element RVE, which function as register elements.

Thus, the source/drain resistance of a selection transistor can be set to a desired value by supplying a read control voltage to the gate of the selection transistor ST. Therefore, compared with the connection of two resistance variable elements RVE in series between the first voltage line SL and the second voltage line BL, the voltage of the connection node CN is generable in high accuracy. The source/drain resistance of the selection transistor ST may be broadly set up by the read control voltage. Therefore, the real amplification transistor AT or the like may be designed with high flexibility. As a result, based on the logic of data held in the real memory cell MC, the real amplification transistor AT may be effectively and/or surely turned on or turned off to read the data without fault.

When the resistance variable element RVE is in a low resistance state (logic 0), the voltage of the connection node CN is relatively low. Also, the source/drain resistance of the real amplification transistor AT is relatively high. When the resistance variable element RVE is in a high resistance state (logic 1), the voltage of the connection node CN is relatively high, and the source/drain resistance of the real amplification transistor AT is relatively low.

For example, in the read operation, when the resistance variable element RVE is in a low resistance state (logic 0), the voltage of the connection node CN is designed so as to be lower than the threshold voltage of the real amplification transistor AT. When the resistance variable element RVE is in a high resistance state (logic 1), the voltage of the connection node CN is designed so as to be higher than the threshold voltage of the real amplification transistor AT. Specifically, at least one of the first high-level voltage of the first voltage line SL and the second high-level voltage of the word line WL is assessed by a circuit simulation or the like to set the voltage of the connection node CN to a desired value. In other words, at least one of the first high-level voltage of the first voltage line SL or the second high-level voltage of the word line WL is adjusted, so that the real amplification transistor AT may turn on or turn off in response to the resistor state of the resistance variable element RVE.

When resistance variable element RVE is in a low resistance state (logic 0), the real amplification transistor AT turns off and the real read line RSL is set to, for example, a floating state. When the resistance variable element RVE is in a high resistance state (logic 1), the real amplification transistor AT turns on and the real read line RSL becomes a ground voltage VSS.

When real read line RSL is in a floating state, the sense amplifier SA determines that the memory cell MC holds logic 0, and outputs a data signal DO of a low level. The floating state of the real read line RSL may be determined by setting the real read line RSL to the high-level voltage by a pull-up resistor. Alternatively, it may be determined by setting the real read line RSL to the high-level voltage by a pre-charge circuit before the read operation. When the voltage of the real read line RSL is the ground voltage VSS, the sense amplifier SA determines that the memory cell MC holds logic 1, and outputs a high-level data signal DO.

Thus, the voltage of connection node CN generated according to the resistance value of the resistance variable element RVE turns into either the high-level voltage or the ground voltage VSS by the amplifying function of the real amplification transistor AT. Thus, the sense amplifier SA may determine the logic held in the memory cell MC easily and certainly. In other words, even when the difference of the resistance value of the resistance variable element RVE in a low resistance state and the resistance value of the resistance variable element RVE in a high resistance state is small, the logic held in the memory cell MC may be determined without fault.

The sense amplifier SA may compare the voltage of the real read line RSL and the reference voltage to determine the logic stored in the memory cell MC and output it as a data signal DO. For example, when the voltage of real read line RSL is higher than the reference voltage, the sense amplifier SA determines that logic 0 is held in the memory cell MC. Furthermore, when the voltage of real read line RSL is lower than the reference voltage, the sense amplifier SA determines that logic 1 is held in the memory cell MC.

As described above, in the first embodiment, a read control voltage is supplied to the gate of the selection transistor ST in the read operation. Thus, the source/drain resistance of the selection transistor ST can be set to the desired value, and the voltage of the connection node CN can be generated in high accuracy. As a result, the real amplification transistor AT can be turned on or turned off without fault in response to the logic of the data held in the real memory cell MC, and the data can be effectively and/or surely read.

Second Embodiment

Figure 2:
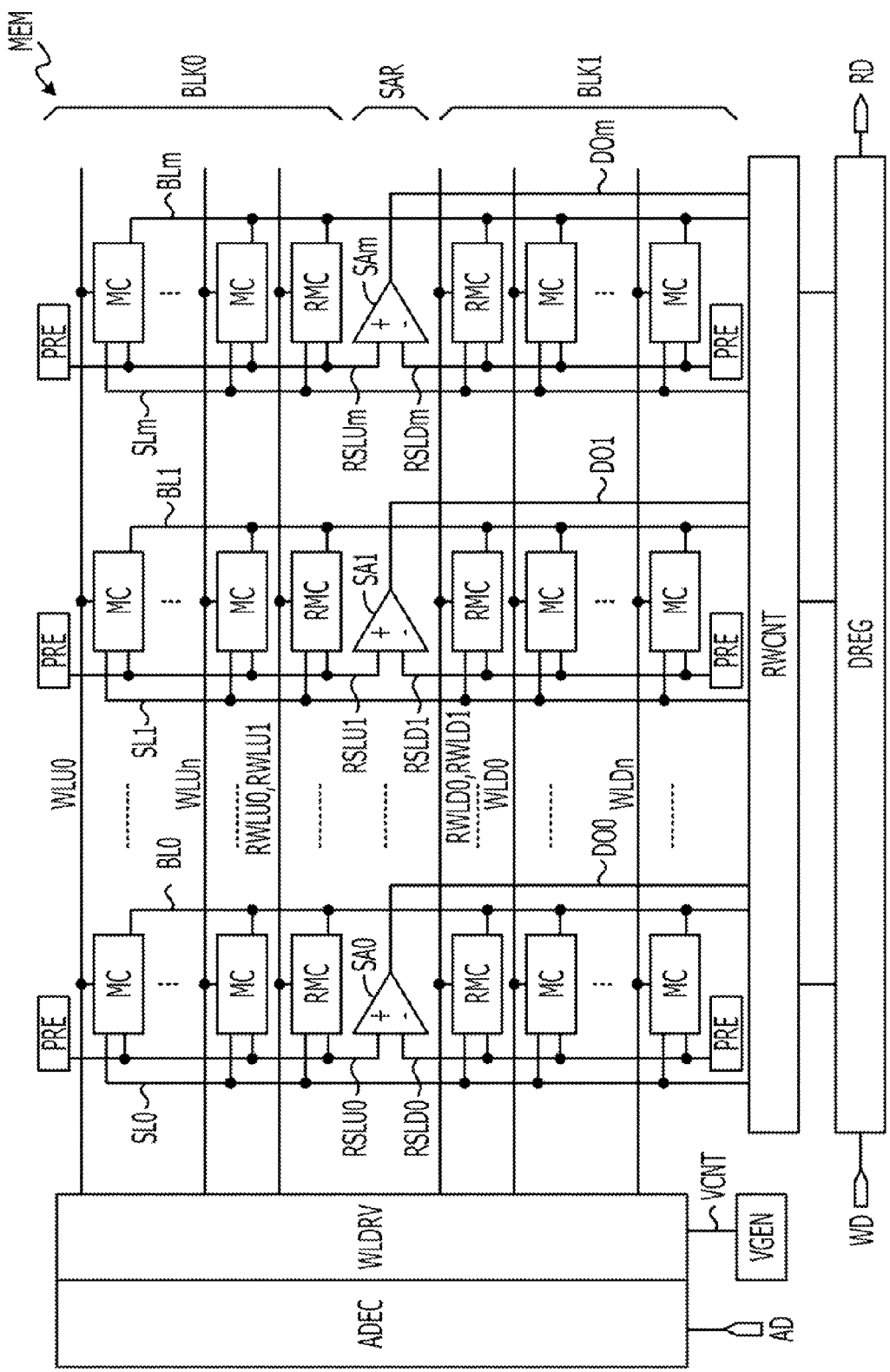
FIG. 2 is a diagram illustrating an exemplary semiconductor memory of a second embodiment.

FIG. 2 illustrates an exemplary semiconductor memory MEM of a second embodiment. The same structural components as those of the above first embodiment are designated by the same reference numerals and their detailed descriptions will be hereinafter omitted. For example, the semiconductor memory MEM is a spin transfer MRAM having a magnetic tunnel junction (MTJ) element.

The semiconductor memory MEM includes memory-blocks BLK0 and BLK1, a sense amplifier column SAR, an address decoder ADEC, a word line driver WLDRV, a voltage-generating part VGEN, a R/W control section RWCNT, and a data register DREG. For example, the memory blocks BLK0 and BLK1 are formed in the vertical direction of FIG. 2 so that they are mirror images of each other. Each of the memory blocks BLK0 and BLK1 includes real memory cells MC arranged in matrix, and reference memory cells RMC and pre-charge circuits PRE, which are arranged in the transverse direction of FIG. 2.

In the memory block BLK0, the real memory cells MC arranged in the transverse direction of FIG. 2 are connected to n+1 real word lines WLU (WLU0, . . . , WLUn), respectively. For example, "n" is "255." In the memory block BLK0, the reference memory cells RMC are connected to reference word lines RWLU0 and RWLU1, respectively. In the memory-block BLK1, the real memory cells MC arranged in the transverse direction of FIG. 2 is connected to n+1 real word lines WLD (WLD0, . . . , WLDn), respectively. In the memory block BLK1, the reference memory cells RMC are connected to reference word lines RWLD0 and RWLD1, respectively.

The real memory cells MC and the reference memory cells RMC, which are arranged in the vertical direction of FIG. 2, are connected to m+1 source lines SL (SL0, SL1, . . . , SLm) and m bit lines BL (BL0, BL1, . . . , BLm), respectively. For example, "m" is "16."

In the memory block BLK0, the real memory cells MC and the reference memory cells RMC, which are arranged in the vertical direction of FIG. 2, are connected to real read lines RSLU (RSLU0, RSLU1 . . . , RSLUm), respectively. In the memory block BLK1, the real memory cells MC and the reference memory cells RMC, which are arranged in the vertical direction of FIG. 2, are connected to real read lines RSLD (RSLD0, RSLD1 . . . , RSLDm), respectively.

The pre-charge circuit PRE is connected to each real read line RSLU and each reference read line RSLD, At the time of the start of read operation, corresponding real read line RSLU and reference read line RSLD are temporarily connected to the pre-charge voltage line. The pre-charge circuit PRE connects the corresponding real read line RSLU and the corresponding reference read line RSLD to low-level voltage lines, such as ground lines, in the write operation.

The sense amplifier column SAR has m+1 sense amplifiers SA (SA0, SA1, . . . , SAm) which are respectively connected to the corresponding real read lines RSLU and the corresponding reference read lines RSLD. Each sense amplifier SA operates in the read operation, and outputs data signals DO (DO0, DO1, . . . , DOm) according to the voltage difference of the corresponding real read lines RSLU and reference read lines RSLD.

Figure 8:
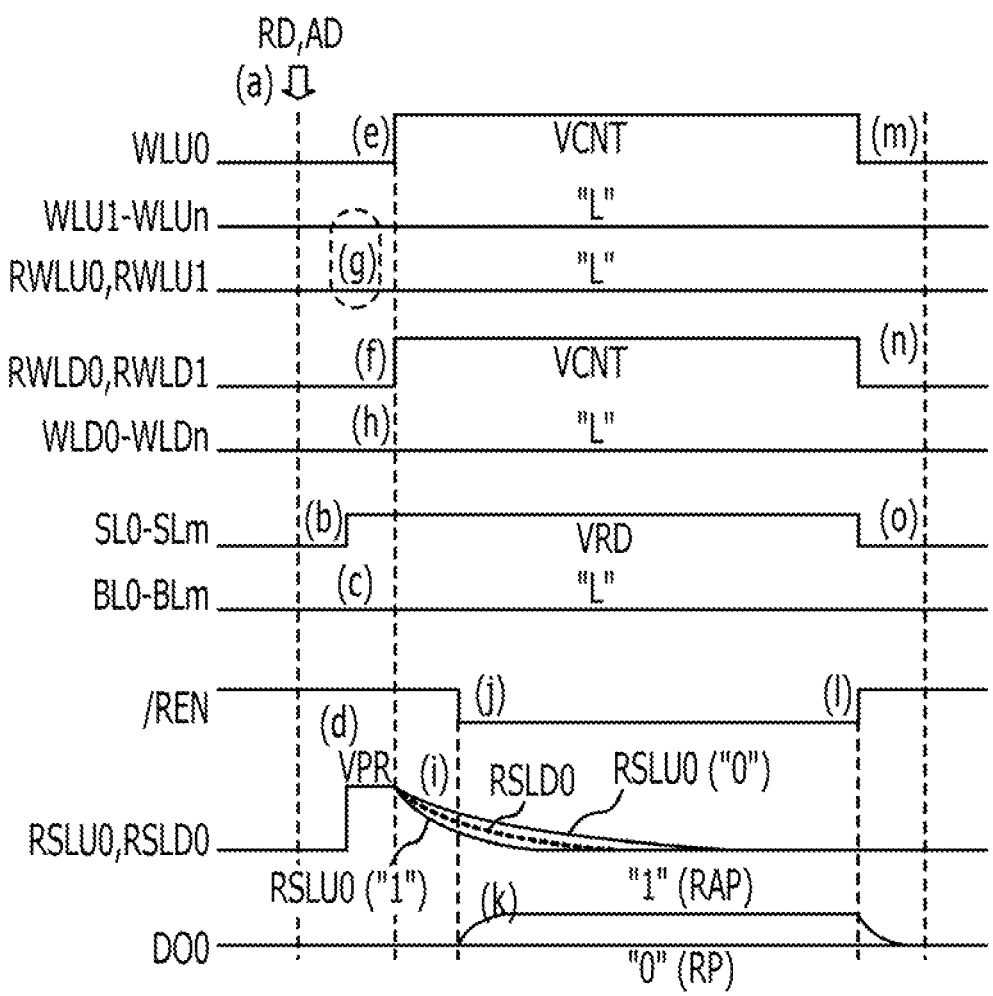
FIG. 8 is a diagram illustrating an exemplary read operation of the semiconductor memory illustrated in FIG. 2.

The address decoder ADEC decodes an address signal AD supplied from the outside of the semiconductor memory MEM, generates a decoded signal, and outputs the decoded signal to the word line driver WLDRV. In the write operation, the word line driver WLDRV sets one of real word lines WLU and WLD to a high-level voltage in response to the decoded signal from the address decoder ADEC. In the read operation, in response to the decode signal from the address decoder ADE, the word line driver WLDRV sets one of the real word lines WLU and WLD and one of the reference word line pairs RWLU0-1 and RWLD0-2 to a high-level voltage, a read control voltage VCNT (FIG. 8).

The voltage-generating section VGEN generates a read control voltage VCNT. When the semiconductor memory MEM has a plurality of circuit blocks illustrated in FIG. 2, the voltage-generating section VGEN is formed in every circuit block. Therefore, the desired read control voltage VCNT can be supplied to the real word lines WLU and WLD and the reference word lines RWLU0-1 and RWLD0-1 in high accuracy without being dependent on the layout of the circuit block. Furthermore, a trimming circuit that finely tunes the read control voltage VCNT may be added to each voltage-generating section VGEN.

The R/W control section RWCNT sets the source line SL and the bit line BL to the predetermined voltage in response to the write data in the write operation. In the read operation, the R/W control section RWCNT sets the source line SL to a read voltage VRD (FIG. 8) and the bit line BL to a low level (for example, ground voltage).

The data register DREG outputs m+1-bit write data WD supplied from the outside of the semiconductor memory MEM to the R/W control section RWCNT in the write operation. The data register DREG outputs m+1-bit write data WD, which is received through the R/W control section RWCNT, as a read data RD to the outside of the semiconductor memory MEM.

Figure 3:
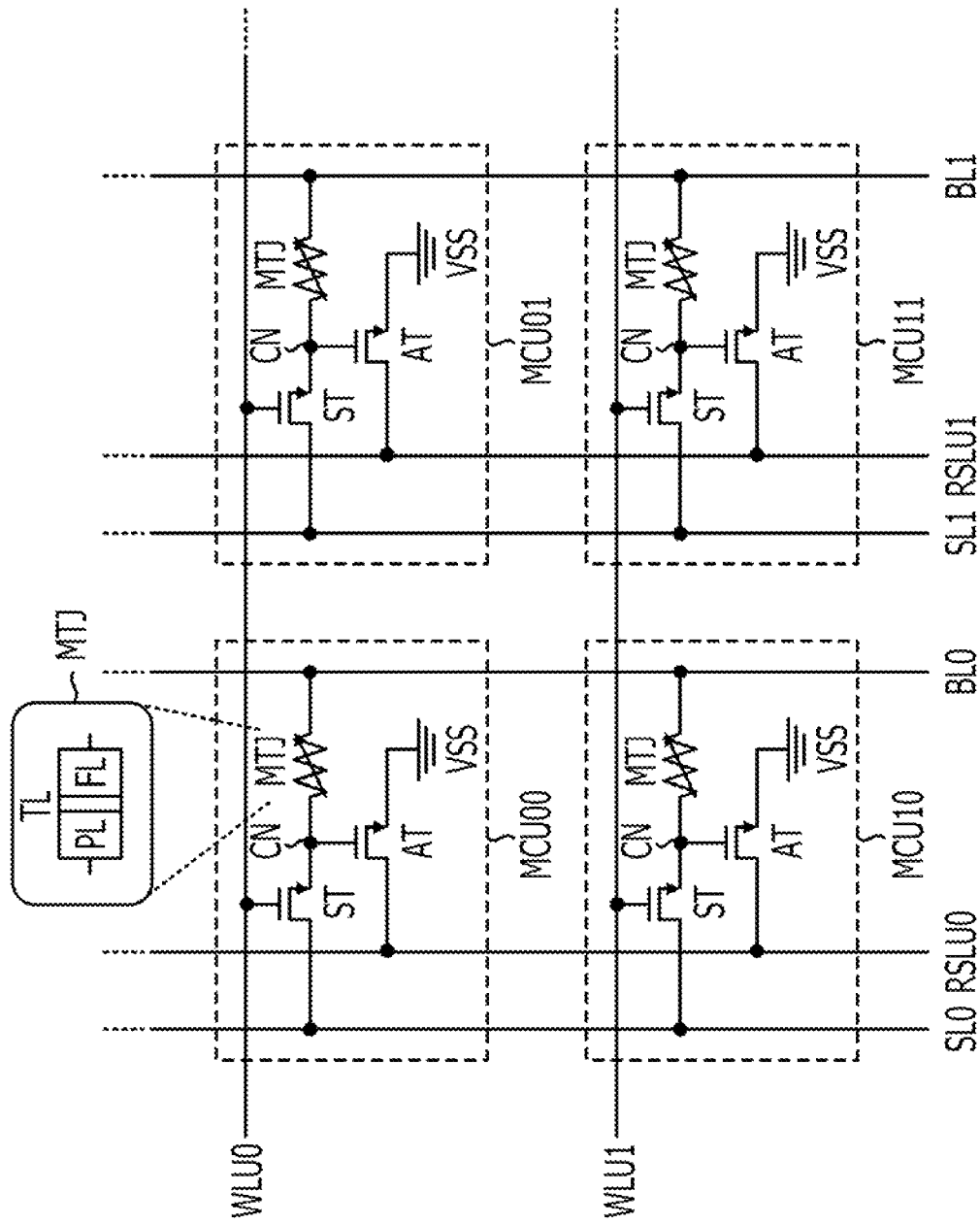
FIG. 3 is a diagram illustrating an exemplary real memory cell illustrated in FIG. 2.

FIG. 3 is a diagram illustrating an exemplary real memory cell MC illustrated in FIG. 2. The real memory cells MC have the same structure. Here, a real memory cell MCU00, which connects to a real word line WLU0, a source line SL0, and a bit line BL0, will be described on behalf of all the real memory cells MC. The real memory cell MCU00 has a MTJ element which is one of the magneto resistance effect elements as a resistance variable element RVE illustrated in FIG. 1. Other structural components of the real memory cell MCU00 is the same as the real memory cell MC illustrated in FIG. 1. Here, the resistance variable element RVE may be a resistance variable element formed in PRAM or a resistance variable element formed in ReRAM.

The MTJ element has two ferromagnetic layers (fixed bed PL and free layer FL) laminated via a tunnel-insulating film TL. The electrical resistance of MTJ element is low when the magnetizing directions of two ferromagnetic layers are in parallel (parallel state P, resistance value RL) and high when the magnetizing directions of two ferromagnetic layers are not in parallel (anti-parallel state AP, resistance value RH). For example, the P state is defined as logic 0 and the AP state is defined as logic 1. Thus, the MTJ element functions as a binary memory element.

Figure 4:
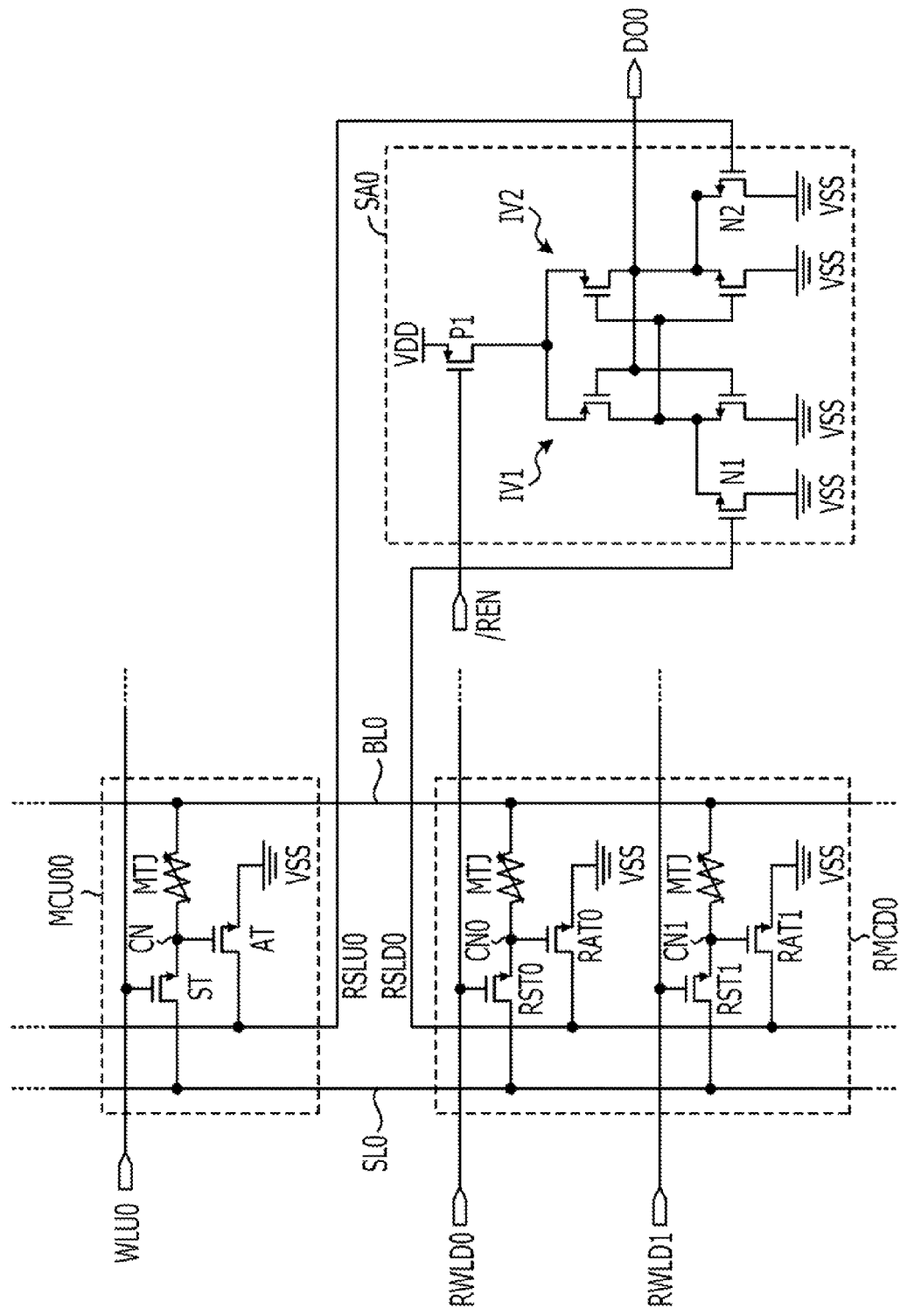
FIG. 4 is a diagram illustrating an exemplary reference memory and an exemplary sense amplifier illustrated in FIG. 2.

FIG. 4 is a diagram illustrating an exemplary reference memory cell RMC and an exemplary sense amplifier SA illustrated in FIG. 2. FIG. 4 illustrates a reference memory cell RMCD0 and a sense amplifier SA0 which correspond to a real memory cell MCU00. Other reference memory cells RMCD and RMCU and other sense amplifiers SA have the same circuitry configurations as those illustrated in FIG. 4, respectively.

The configuration of the reference memory cell RMCD0 corresponds to almost the configuration of a set of two real memory cells MCU00. In other words, the reference memory cell RMCD0 includes two selection transistors RST0 and RST1, two MTJ elements, and two reference amplification transistors RAT0 and RAT1.

In the selection transistor RST0, a drain is connected to a source line SL0, a gate is connected to a reference word line RWLD0, and a source is connected to a connection node CN0. One of the MTJ elements is arranged between the connection node CN0 and a bit line BL0. In the reference amplification transistor RAT0, a drain is connected to a reference read line RSLD0, a gate is connected to a connection node CN0, and a source is connected to a ground line VSS. Similarly, in the selection transistor RST1, a drain is connected to the source line SL0, a gate is connected to reference word line RWLD1, and a source is connected to a connection node CN1. The other of the MTJ elements is arranged between a connection node CN1 and a bit line BL0. In the reference amplification transistor RAT1, a drain is connected to the reference read line RSLD0, a gate is connected to the connection node CN1, and a source is connected to the ground line VSS.

In the reference memory cell RMCD0, one of the MTJ elements is preset to a high resistance state and the other of the MTJ elements is preset to a low resistance state. Furthermore, the gate width of each of the reference amplification transistors RAT0 and RAT1 is set to half of the gate width of the real amplification transistor AT in the real memory cell MC. Therefore, as illustrated in FIG. 8, in the read operation, the curve of the voltage change of reference read line RSLD0 may be located almost at the center between the curve of the voltage change of the real read line RSLU0 when reading logic 1 and the curve of the voltage change of the real read line RSLU0 when reading logic 0. Specifically, the characteristics of the MTJ element shift in the same direction when the manufacturing conditions of the semiconductor memory MEM are changed. Alternatively, the characteristics of the selection transistors ST, RST0, and RST1 and the amplification transistors AT, RAT0, and RAT1 shift in the same direction. Therefore, even when the manufacturing conditions of the semiconductor are changed, the voltage of the reference read line RSLD0 may always be set to between the voltage of the real read line RSLU0 when reading logic 1 and the voltage of the real read line RSLU0 when reading logic 0. Therefore, the read-out margin of the semiconductor memory MEM may be extensively improved compared with one known in the art.

The sense amplifier SA0 is of a cross-couple type having a differential input pair, and includes a pair of CMOS inverters IV1 and IV2 where the input of the one CMOS inverter is connected to the output of the other CMOS inverter. The source of the pMOS transistor in each of the CMOS inverters IV1 and IV2 is connected to the power line VDD through the switch transistor P1. The switch transistor P1 is turned on in response to the read-out enable signal/REN activated by the low level in the read operation.

The output of the CMOS inverter IV1 is connected to the ground line VSS through the nMOS transistor N1 by which the gate is connected to the reference read line RSLD0. The output of the CMOS inverter IV2 is connected to the ground line VSS through the nMOS transistor N2 by which the gate is connected to the real read line RSLU0. Furthermore, under the activation of a read-out enable signal/REN, the sense amplifier SA0 outputs a data signal DO0 from the output of the CMOS inverter IV2 in response to the voltage difference between the real read line RSLU0 and the reference read line RSLD0. Specifically, when the voltage of the real read line RSLU0 is higher than the voltage of the reference read line RSLD0 (i.e., when the MTJ element of the real memory cell MCU00 is in a low resistance state (logic 0 is stored)), a data signal DO0 of logic 0 is output. When the voltage of the real read line RSLU0 is lower than the voltage of the reference read line RSLD0 (i.e., when the MTJ element of the real memory cell MCU00 is in a high resistance state (logic 1 is stored)), a data signal DO0 of logic 1 is output.

In the second embodiment, when the read operation of the real memory cell MC in the memory-block BLK0 is performed, the reference memory cell RMC of the memory-block BLK1 is used. When the read operation of the real memory cell MC in the memory-block BLK1 is performed, the reference memory cell RMC of the memory-block BLK0 is used. Therefore, the length of the real read line RSLU and the length of the reference read line RSLD, which are connected to the sense amplifier SA, may be equal to each other. The number of the real memory cells MC and number of the reference memory cell RMC, which are connected to the real read line RSLU, may be equal to the number of the real memory cells MC and the number of the reference memory cell RMC, which are connected to the reference read line RSLD, respectively. Therefore, the load carrying capacity of the real read line RSLU and the load carrying capacity of the reference read line RSLD may be equal to each other. Thus, the input timing of the differential voltage to the sense amplifier SA may be prevented from being shifted. As a result, the read-out margin of the semiconductor memory MEM can be further improved.

Figure 5:
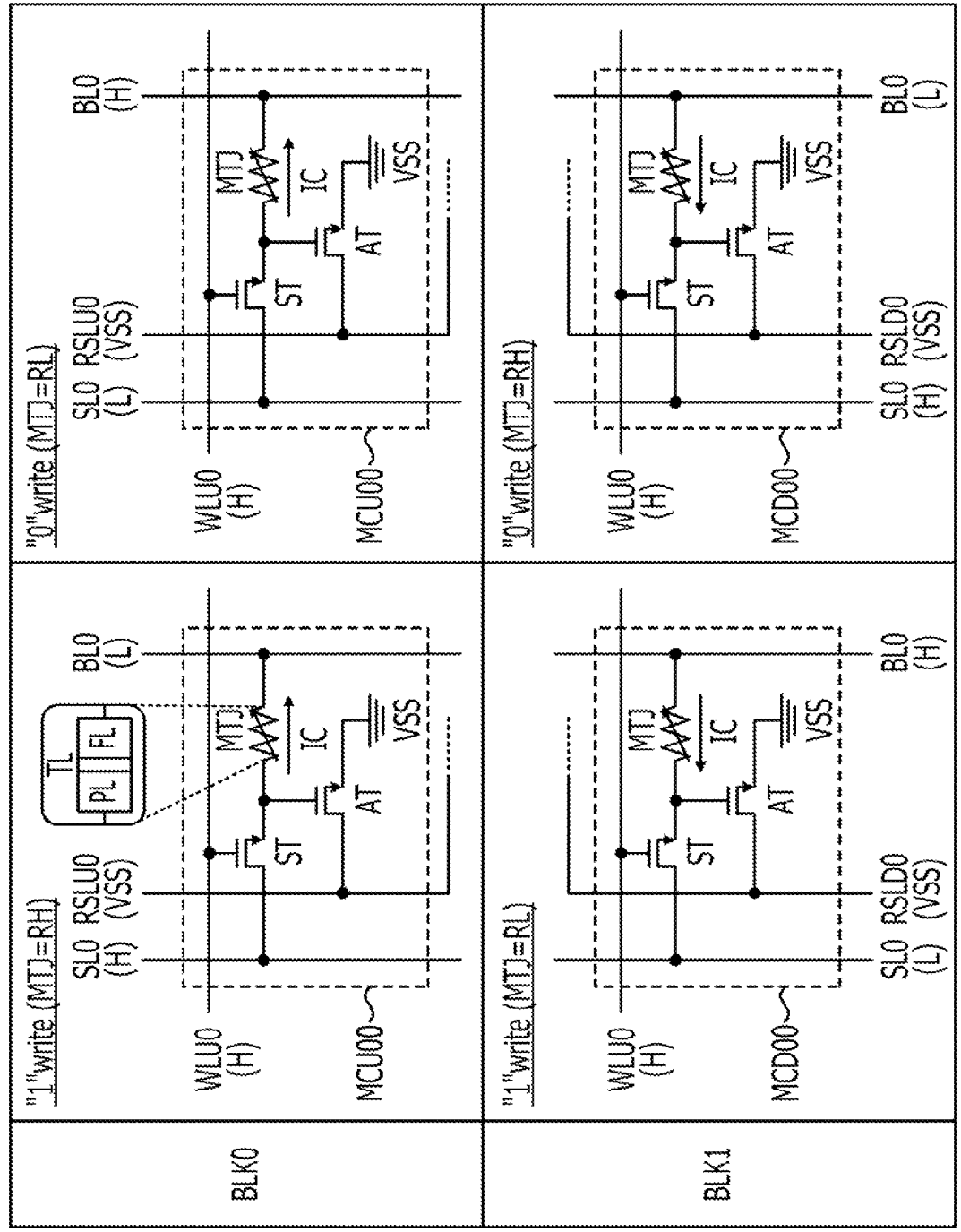
FIG. 5 is a diagram illustrating a state of a real memory cell in writing operation of the semiconductor memory illustrated in FIG. 2.

FIG. 5 is a diagram illustrating an exemplary real memory cell MC when the semiconductor memory MEM illustrated in FIG. 2 is in the write operation. This example illustrates the writing operation of the real memory cell MCU00 connected to the real word line WLU of the memory-block BLK0 and the writing operation of the real memory cell MCD00 connected to the real word line WLD0 of memory-block BLK1.

In the write operation of the memory-block BLK0, since the selection transistor ST is turned on, the real word line WLU0 is set to a high level H. When logic 1 is written in the real memory cell MCU00, the source line SL0 is set to a high level H, and the bit line BL0 is set to a low level L. Therefore, a write current flows from the pinned layer PL to free layer FL of the MTJ element, and the MTJ element is set to a high resistance state (resistance value RH). On the other hand, when logic 0 is written in the real memory cell MCU00, the source line SL0 is set to a low level H, and the bit line BL0 is set to a high level H. Therefore, the write current flows from the free layer FL to pinned layer PL of the MTJ element, and the MTJ element is set to a low resistance state (resistance value RL).

On the other hand, in the write operation of the memory-block BLK1, the relationship between the logic of data written in the real memory cell MCD00 and the resistant state of the MTJ element is opposite to the relationship between the logic of data written in the real memory cell MCU00 of the memory block BLK0 and the resistance state of the MTJ element. This is because, in the read operation of the memory-block BLK1, the real read line RSLU is driven by the reference amplification transistors RAT1 and RAT2 of the reference memory cell RMC and the reference read line RSLD is driven by the real amplification transistor AT of the real memory cell MC. In other words, the data of the opposite logic is written in the memory-block BLK1 to reverse the relationship between the real read line and the reference read line by the read operation of the memory block BLK0 and the read operation of the memory block BLK1.

Specifically, in the write operation of the memory block BLK1, the source line SL0 is set to a low level L when logic 1 is written in the real memory cell MCD00 and the bit line BL0 is set to a high level H. Therefore, write current flows from the free layer FL to pinned layer PL of the MTJ element. Then, MTJ element is set to a low resistance state (low resistance value RL). On the other hand, when logic 0 is written in the real memory cell MCD00, the source line SL0 is set to a high level H and the bit line BL0 is set to a low level L. Therefore, write current flows from the pinned layer PL to free layer FL of the MTJ element, and the MTJ element is set to a high resistance state (resistance value RH).

In the write operation, furthermore, the real read line RSLU0 and the reference read line RSLD0 are set to the ground voltage VSS (low level). Both the source voltage and the drain voltage of the real amplification transistor AT turn into ground voltage VSS. Therefore, the current flow between the source and the drain of the real amplification transistor may be inhibited and/or prevented. Furthermore, the voltage of the real read line RSLU0 and the voltage of the reference read line PSLD0 may be inhibited and/or prevented from effecting a gate voltage through a gate insulating film. Therefore, the real amplification transistor AT does not affect the write operation.

Figure 6:
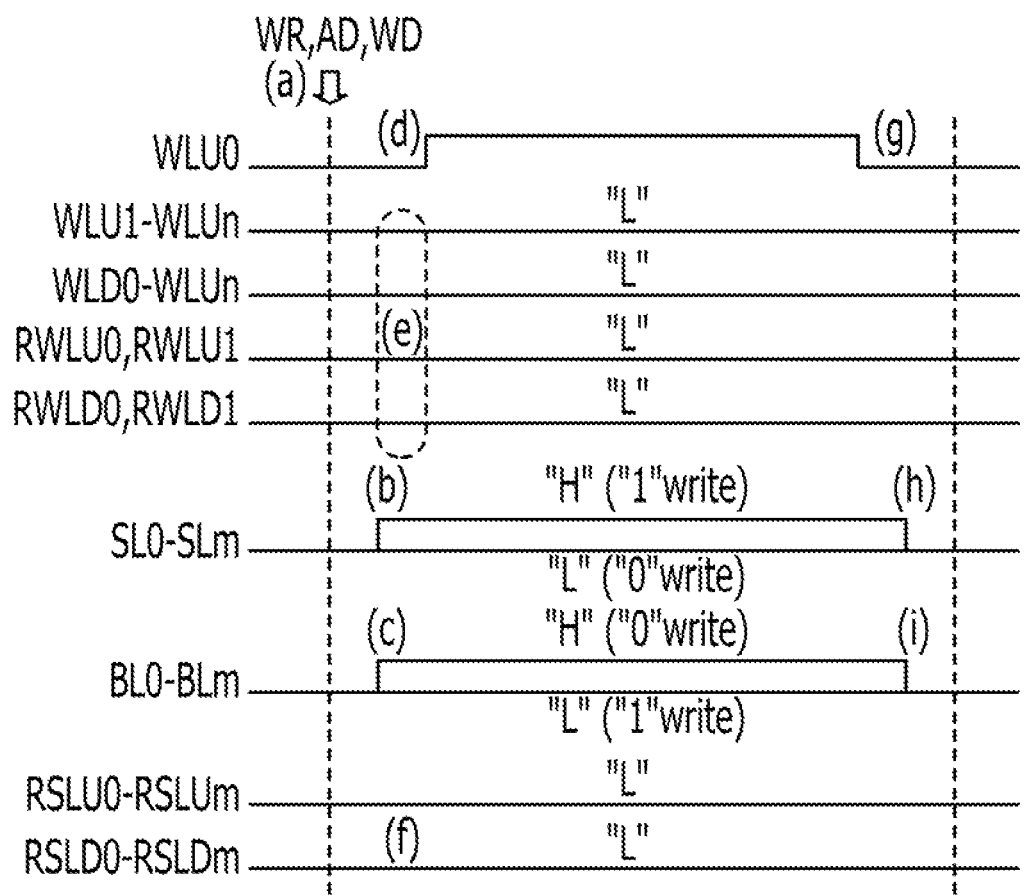
FIG. 6 is a diagram illustrating an exemplary writing operation of a memory block BLK0 of the semiconductor memory illustrated in FIG. 2.

FIG. 6 is a diagram illustrating an exemplary write operation of the memory block BLK0 of the semiconductor memory MEM illustrated in FIG. 2. In this example, data is written in the real memory cell MC connected to the real word line WLU0 of the memory block BLK0. First, a write command WR, an address signal AD, and write data WD are supplied to the external terminal of the semiconductor memory MEM (FIG. 6(a)).

The R/W control section RWCNT illustrated in FIG. 2 sets the source line SL (SL0-SLm) and the bit line BL to a high level H or a low level L in response to the write data WD (FIG. 6(b), (c)). As illustrated in FIG. 5, when logic 1 is written, the source line SL is set to a high level H and the bit line BL is set to a low level L. When logic 0 is written, the source line SL is set to a low level H, and the bit line BL is set to a high level H.

Next, the word line driver WLDRV illustrated in FIG. 2 activates the real word line WLU0 to a high-level in response to an address signal AD (FIG. 6(d)). The word line driver WLDRV sets real word lines WLU1-WLUn and WLD0-WLD and reference word lines RWLU0-1 and RWLD0-1, which are not related to the write operation, to a low level L (FIG. 6(e)). Each pre-charge circuit PRE illustrated in FIG. 2 sets real read lines RSLU0-$m$ and reference read lines RSLD0-$m$ to a low level L (FIG. 6(f)). Therefore, the write operation of the memory block BLK0 illustrated in FIG. 5 is performed. After the data is written in the real memory cell MC, the word line driver WLDRV deactivates the real word line WLU0 to a low level (FIG. 6(g)). Then, the R/W control section RWCNT resets the source line SL (SL0-SLm) and the bit line BL (BL0-BLm) to a low level L (FIG. 6(h), (i)), and the write operation is completed.

Figure 7:
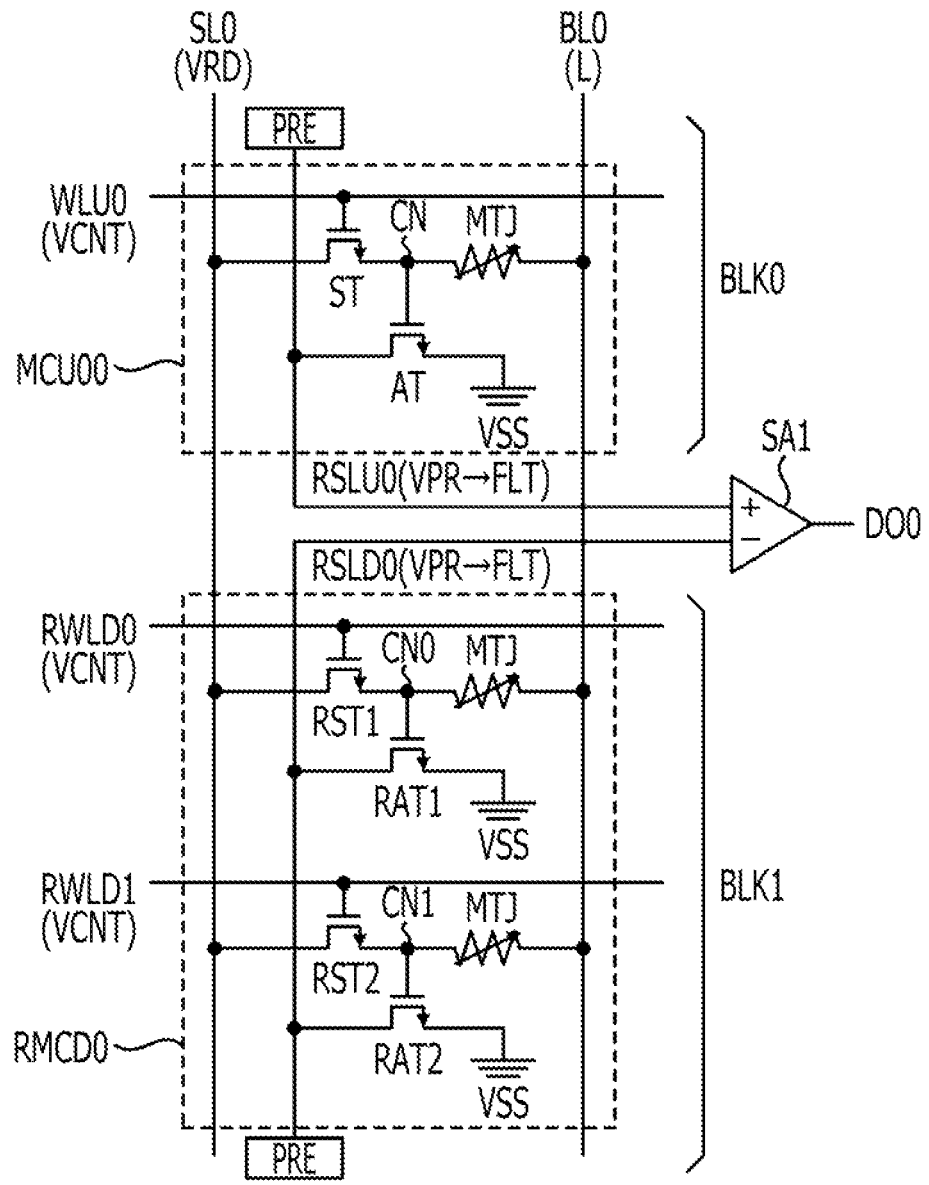
FIG. 7 is a diagram illustrating the state of the real memory cell and the state of the reference memory cell in read operation of the semiconductor memory illustrated in FIG. 2.

FIG. 7 illustrates the state of the real memory cell MC and the state of the reference memory RMC in the read operation of the semiconductor memory MEM illustrated in FIG. 2. In this example, data is read from the real memory cell MCU00 connected to the real word line WLU0.

First, the pre-charge circuit PRE sets the real read line RSLU0 and the reference read line RSLD0 to a pre-charge voltage VPR at the time of the start of read operation. Before the real word line WLU0 and the reference word lines RWLD0-1 are activated, the pre-charge circuit PRE separates the real read line RSLU0 and the reference read line RSLD0 from the pre-charge voltage line VPR, and sets them to a floating state FLT.

By the read operation of the memory block BLK0, the word line driver WLDRV illustrated in FIG. 2 sets the real word line WLU of the memory block BLK00 and the reference word lines RWLD0-1 of the memory block BLK1" to a read control voltage VCNT. For example, the read control voltage VCNT is higher than the power supply voltage VDD but lower than the activation voltage of the real word line WL in the write operation.

Although not limited in particular, when the power supply voltage VDD is 1.2V, the activation voltage of the real word line WL in the write operation is set to 2.0 V and the read control voltage VCNT is set to 1.7 V. Therefore, in the write operation, the on-resistance of the selection transistor ST is sufficiently lowered to flow a sufficient amount of write current into the MTJ element. In the read operation, the on-resistance of the selection transistor ST is sufficiently increased compared with one in the write operation. Thus, a gate voltage CN of the real amplification transistor AT may be set to the desired and/or optimal value.

The R/W control section RWCNT illustrated in FIG. 2 sets the source line SL to a read voltage VRD and the bit line BL0 to a low level (for example, ground voltage VSS). Although not limited in particular, for example, the read voltage VRD is a power supply voltage VDD (1.2 V). Therefore, the source/drain resistances of the respective selection transistors ST, RST1, and RST2 are decreased. The selection transistors ST, RST1, and RST2 function as resistance elements.

Therefore, the connection node CN of the real memory cell MCU00 generates a voltage depending on the on-resistance value of the selection transistor ST and the resistance value of the MTJ element. Although not limited in particular, the selection transistors ST, RST1, and RT2 have an on-resistance of 2.2 kΩ. The voltage of the connection node CN is relatively high when logic 1 is written in the MTJ element. The voltage of the connection node CN is relatively low when logic 0 is written in the MTJ element.

For example, the voltage of the connection node CN becomes higher than the threshold voltage of the real amplification transistor AT when the MTJ element is in a high resistance state. The voltage of the connection node CN becomes smaller than the threshold voltage of the real amplification transistor AT when the MTJ element is in a low resistance state. Therefore, when the MTJ element is in a high resistance state, the source/drain resistance of the real amplification transistor AT is low, and when an MTJ element is in a low resistance state, the source/drain resistance of real amplification transistor AT is high. The voltage of the real read line RSLU0 decreases gradually from the pre-charge voltage VPR in response to the value of the source/drain resistance of the real amplification transistor AT.

Although not limited in particular, the resistance value of the MTJ element in a high resistance state is 1.8 kΩ, and the resistance value of the MTJ element in a low resistance state is 1.1 kΩ. In the case that the on-resistance of the selection transistor ST is 2.2 kΩ, for example, the voltage of the connection node CN is 540 mV when the MTJ element is in a high resistance state and 400 mV when the MTJ element is in a low resistance state. For example, the threshold voltage of the real amplification transistor AT is 470 mV.

Similarly, the connection node CN1 of the reference memory cell RMCD0 generates a voltage depending on the resistance value of selection transistor ST1 and the resistance value of the MTJ element. The connection node CN2 of the reference memory cell RMCD0 generates a voltage depending on the resistance value of the selection transistor ST2, and the resistance value of the MTJ element. For example, the MTJ element connected to the connection node CN1 is set to a high resistance state, and the MTJ element connected to connection node CN2 is set to the low resistance state. At this time, the voltage of the connection node CN1 is equal to the voltage of the connection node CN of the real memory cell MC set in a high resistance state. Then the voltage of the connection node CN2 is equal to the voltage of the connection node CN of the real memory cell MC set in a low resistance state.

The source/drain resistance of the reference amplification transistors RAT1 and RAT2 decreases depending on the voltages of the connection nodes CN1 and CN2, respectively. Therefore, the source/drain current flows from the reference-out line RSLD0 to the ground line VSS through the reference amplifier transistors RAT1 and RAT2. Then, the voltage of the reference read line RSLD0 is gradually decreased from the pre-charge voltage VPR. Here, the threshold voltages of the reference amplification transistors RAT1 and RAT2 are designed to be equal to the threshold voltage of the real amplification transistor AT. Furthermore, the gate width of each of the reference amplification transistors RAT1 and RAT2 is designed to be half of the gate width of the real amplification transistor AT in the real amplifier transistor AT.

Thus, the current that flows into the reference amplification transistor RAT1 is half of the current flowing into the real amplification transistor AT of the real memory cell MC that holds logic 1. Thus, the current that flows into the reference amplification transistor RAT2 is half of the current flowing into the real amplification transistor AT of the real memory cell MC that holds logic 0. Therefore, the current that flows into each of the reference amplification transistors RAT1 and RAT2 is an average between a current flowing into the real amplification transistor AT of the real memory cell MC that holds logic 1 and a current flowing into the real amplification transistor AT of the real memory cell MC that holds logic 0. As a result, the voltage of reference read line RSLD0 turns into almost the center value between the voltage of the real read line RSLU0 when reading logic 1 from the real memory cell MC and the voltage of the real read line RSLU0 when reading logic 0 from the real memory cell MC.

FIG. 8 is a diagram illustrating an exemplary read operation of the semiconductor memory MEM illustrated in FIG. 2. In this example, data is read from the real memory cell MC connected to the real word line WLU0. In FIG. 8, the real memory cell MCU00 illustrated in FIG. 7 is focused and described.

First, a read command RD and an address signal AD are supplied to the external terminal of the semiconductor memory MEM (FIG. 8(a)). The R/W control section RWCNT illustrated in FIG. 2 sets the source line SL (SL0-SLm) to a read voltage VRD and the bit line BL (BL0-BLm) to a low level L (for example, ground voltage VSS) (FIG. 8(b), (c)). The pre-charge circuit PRE temporarily connects the real read line RSLU0 and the reference read line RSLD0 to the pre-charge voltage line VPR before the real word line WLU0 is activated (FIG. 8(d)). Therefore, the real read line RSLU0 and the reference read line RSLD0 are temporarily set to the pre-charge voltage VPR. Although not limited in particular, for example, the pre-charge voltage line VPR is 1.2 V which is the same as the supply voltage VDD. Here, other real read lines RSLU1-RSLUm(s) and reference read lines RSLD1-RSLDm are also temporarily set to the pre-charge voltage VPR. The real read lines RSLU0-RSLUm and the reference read-out lines RSLD0-RSLDm are set to a floating state after being set to the pre-charge voltage VPR.

Next, the word line driver WLDRV illustrated in FIG. 2 activates the real word line WLU0 and the reference word lines RWLD0-1 to the read control voltage VCNT in response to the address signal AD (FIG. 8(e), (f)). The word line driver WLDRV sets real word lines WLU1-WLUn and WLD0-WLDn and reference word lines RWLU0-1, which are not related to the read operation, to a low level L (FIG. 8(g), (h)).

The activation of the real word line WLU0 turns on the selection transistor ST illustrated in FIG. 7, and causes the flow of current into the real amplification transistor AT in response to the voltage of the connection node CN. Similarly, the activation of the reference word lines RWLD0-1 turns on the selection transistor RST1 and RST2 illustrated in FIG. 7, and causes the flow of current into the reference amplification transistors RAT1 and RAT2 in response to the voltage of the connection nodes CN1 and CN2. Therefore, the voltage of real read line RSLU0 and the reference read line RSLD0 are gradually decreased (FIG. 8(i)). Other real read lines RSLU1-m and reference read lines RSLD1-m are also decreased. In this case, the voltage of the reference read line RSLD0 is a value between the voltage of the real read line RSLU0 corresponding to logic 0 and the voltage of the real read line RSLU0 corresponding to logic 1 as represented by the dashed line illustrated in FIG. 8.

Next, the read-out enable signal/REN is activated to a low level, and the sense amplifier SA starts operation (FIG. 8(j)). Based on a voltage difference between the real read line DSLU0 and the reference read line RSLD0, the sense amplifier SA determines the logic of data held in the real memory cell MCU00 and outputs the logic of the date as a data signal D0 (FIG. 8(k)). By using amplification actions of the amplifier transistors AT, RAT1, and RAT2, the voltage difference of real read line RSLU0 and reference read line RSLD0 which is the input voltage of sense amplifier SA is quickly increased by using amplification transistors AT and RAT1 and the amplifying function of RAT2. Therefore, operation-start timing of the sense amplifier SA may be faster than that of the related art and a read-out access time may be shortened. Furthermore, Since the voltage difference of the real read line RSLU0 and the reference read line RSLD0 may be enlarged compared with that of the related art, a read-out margin can be enlarged. As a result, the yield of the semiconductor memory MEM may be improved.

When the MTJ element of the real memory cell MCU00 is in a high resistance state, data signal D0 of logic 1 is output. When the MTJ element of the real memory cell MCU00 is in a low resistance state, data signal D0 of logic 0 is output. Then, the read-out enable signal/REN is deactivated to a high level (FIG. 8(l)). The real word line WLU0 and the reference word lines RWLD0-1 and the source lines SL0-m are set to a low level, and the read operation is completed (FIG. 8(m), (n), (o)).

Figure 9:
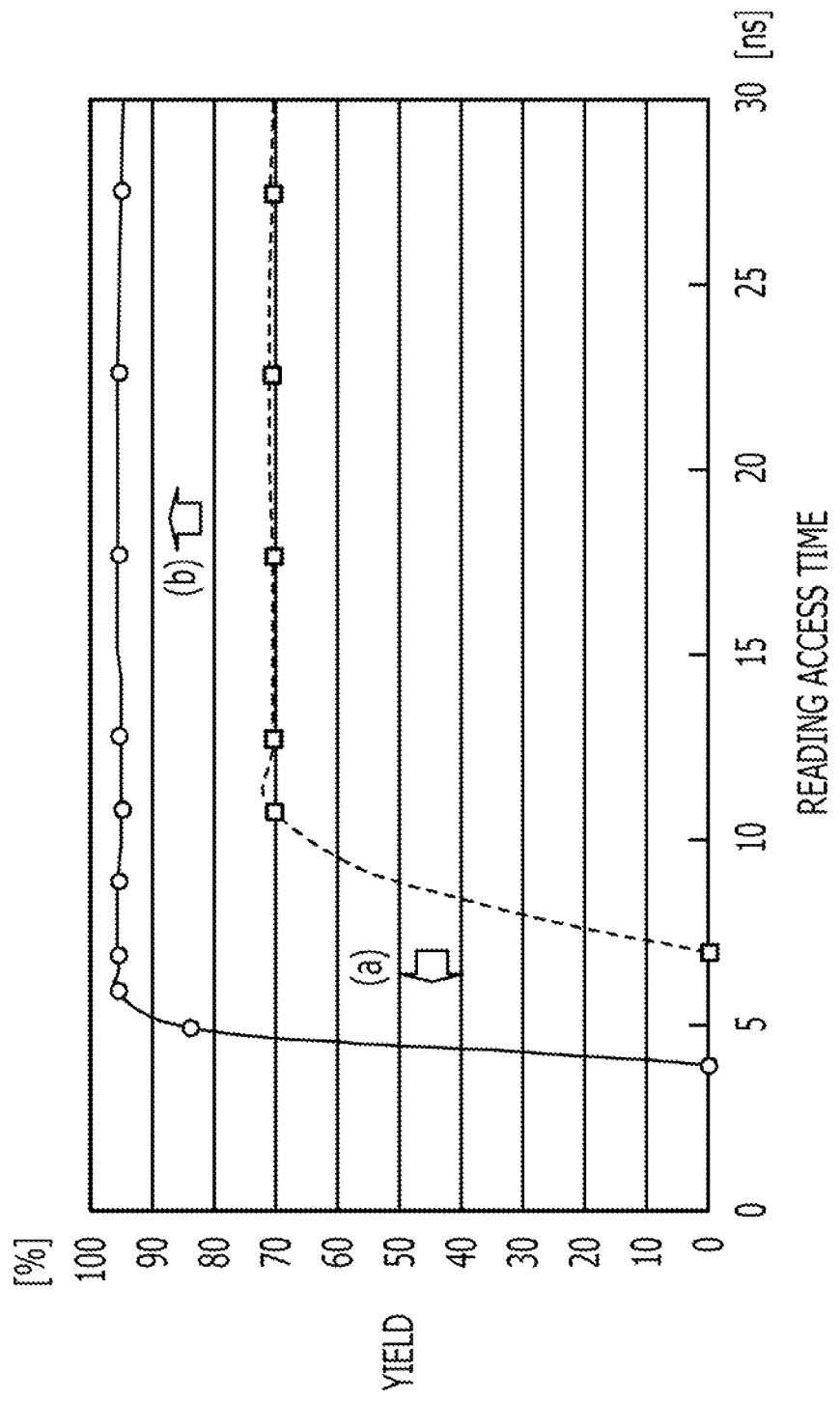
FIG. 9 is a diagram illustrating an exemplary characteristic feature of the semiconductor memory illustrated in FIG. 2.

FIG. 9 illustrates an exemplary characteristic feature of the semiconductor memory MEM illustrated in FIG. 2. In FIG. 9, circles (on solid line) represent the characteristic feature of semiconductor memory MEM illustrated in FIG. 2 and squares (on dashed line) represent the characteristic feature of the typical spin transfer MRAM having a memory cell without a real amplification transistor AT.

The semiconductor memory MEM illustrated in FIG. 2 reads data by using the amplification actions of the amplifier transistors AT, RAT1, and RAT2. Thus, a voltage difference between the real read line and the reference read line RSLD0 is quickly increased. Therefore, operation-start timing of the sense amplifier SA may be faster than one of the related art. Thus, a read-access time can be extensively shortened (FIG. 9(a)).

The voltage difference between the real read line RSLU0 and the reference read line RSLD0 can be increased by the amplification transistors AT, RAT1, and RAT, so that a read-out margin may be enlarged. As a result, FIG. 9(b), a defective percentage by shortage of the read-out margin may be reduced and the yield may be sharply improved compared with one of the related art. The maximal value of the yield of the semiconductor memory MEM illustrated in FIG. 2 is about 95%. This is because a percentage of defectives due to a foreign substance in a manufacturing step and an unusual shape of a circuit pattern is about 5%. In the typically known spin-injection type MRAM, a percentage of defectives due to a foreign substance or the like is about 5%. Thus, the defective percentage by shortage of the conventional read-out margin is about 25%.

In the second embodiment, the example has been described as one where the embodiment is applied to the semiconductor memory MEM having the MTJ element as a resistance variable element. However, the second embodiment may be applied to a semiconductor memory MEM having a resistance variable element formed in PRAM. Alternatively, the second embodiment may be applied to a semiconductor memory MEM having a resistance variable element formed in ReRAM.

Third Embodiment

Figure 10:
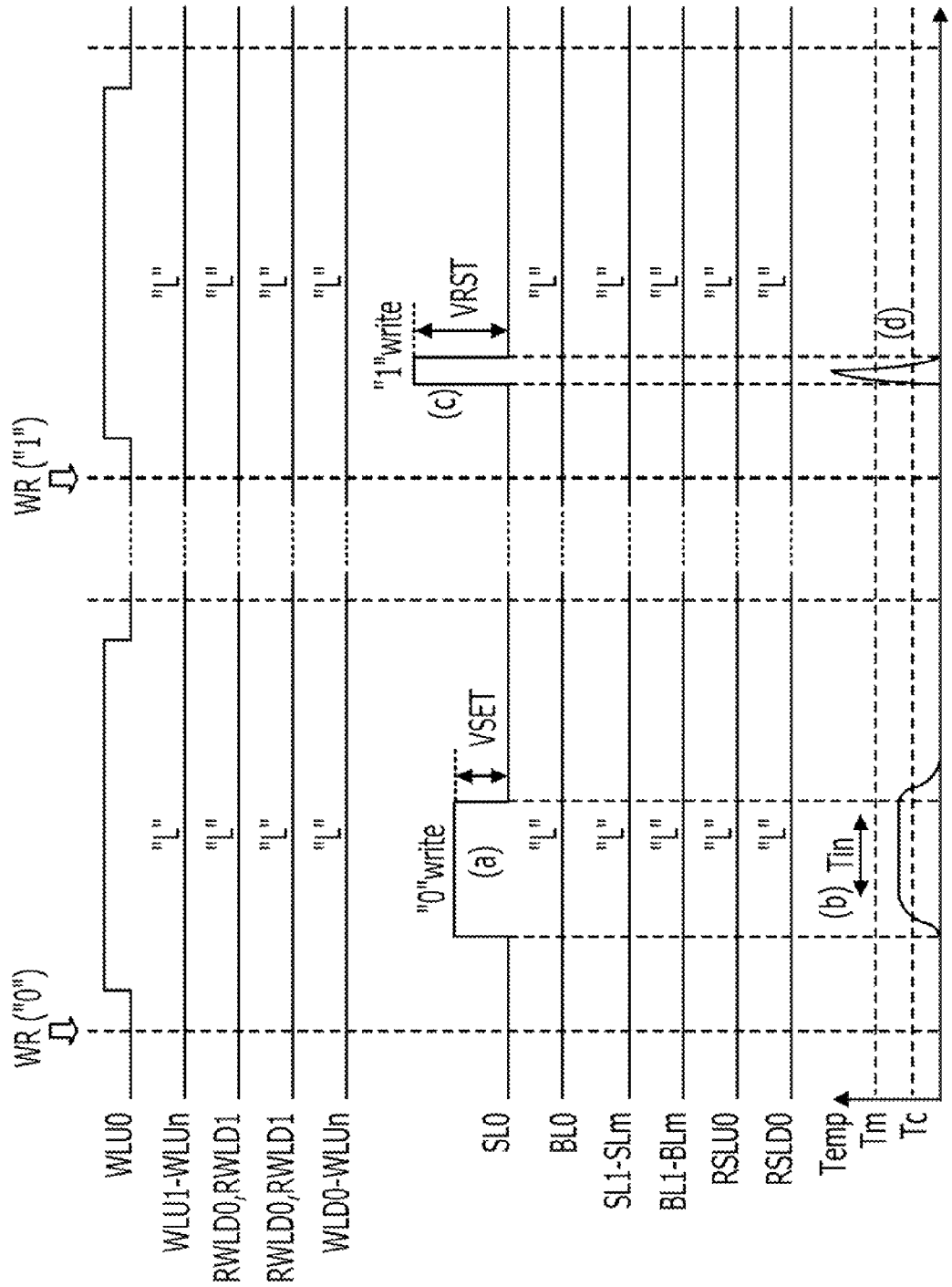
FIG. 10 is a diagram illustrating an exemplary write operation of the semiconductor memory having a resistance variable element formed in a phase change memory of a third embodiment.

FIG. 10 is a diagram illustrating an exemplary write operation of a semiconductor memory MEM having a resistance variable element formed in PRAM. Read operation is the same as one illustrated in FIG. 8. The resistance variable element of PRAM is in a high resistance state (logic 1) when becoming amorphous, and when crystallized, the resistance variable element of PRAM turns into a low resistance state (logic 0).

In the write operation of logic 0, a set pulse voltage VSET with a wide width is supplied to a source line SL0, and a bit line BL0 is set to a low level (ground voltage VSS) (FIG. 10(a)). At this time, the set pulse voltage VSET is applied to the both ends of a resistance variable element. The set pulse voltage VSET is determined so that the temperature of the resistance variable element is not less than a crystallization temperature Tc or more but not more than a melting point Tm. The resistance variable element is crystallized when it is held at a temperature of not less than its crystallization temperature Tc but not more than its melting point Tm for a time period of a crystallization time Tin or more (FIG. 10(b)).

In the write operation of logic 1, a reset pulse voltage VRST with a narrow width is supplied to the source line SL0, and the bit line BL0 is set to a low level (ground voltage VSS) (FIG. 10(c)). At this time, the reset pulse voltage VRST is applied to the both ends of the resistance variable element. The reset pulse voltage VRST is determined so that the temperature of the resistance variable element is not less than a melting point Tm. The resistance variable element is heated at a melting point Tm or more by a reset pulse voltage with a narrow width and quickly cooled to be brought into an amorphous form (FIG. 10(d)).

As described above, in the third embodiment, the same effects as those of the above second embodiment may be obtained. Furthermore, the use of the reference memory cell RMC may set the voltage of the reference read line RSLD0 to almost the center between the voltage of the real read line RSLU0 corresponding to logic 1 and the voltage of the real read line RSLU0 corresponding to logic 0. Therefore, the reading access time of the semiconductor memory MEM can be shortened, and a read-out margin may be improved.

When the resistance value of the MTJ element in the real memory cell shifts from an expected value with the change of the manufacturing conditions of the semiconductor memory MEM, the resistance value of the MTJ element in the reference memory cell may also be shifted. Therefore, variations in the voltage of the connection node CN in the real memory cell MC and variations in the voltage of the connection nodes CN1 and CN2 in the reference memory cell RMC can be reduced. Thus, a read-out margin can be further improved.

The numbers of memory cells MC and RMC, which are respectively connected to the real read line RSLU0 and the reference read line RSLD0, may be equal to each other. Thus, the load capacity of the real read line RSLU0 may be equal to the load capacity of the reference read line RSLD0. As a result, the load capacity of the real read line RSLU and the load capacity of the reference read line RSLD may be equal to each other. The input timing of a difference voltage to the sense amplifier SA may be inhibited and/or prevented from shifting. As a result, a read-out margin may be further improved.

Fourth Embodiment

Figure 11:
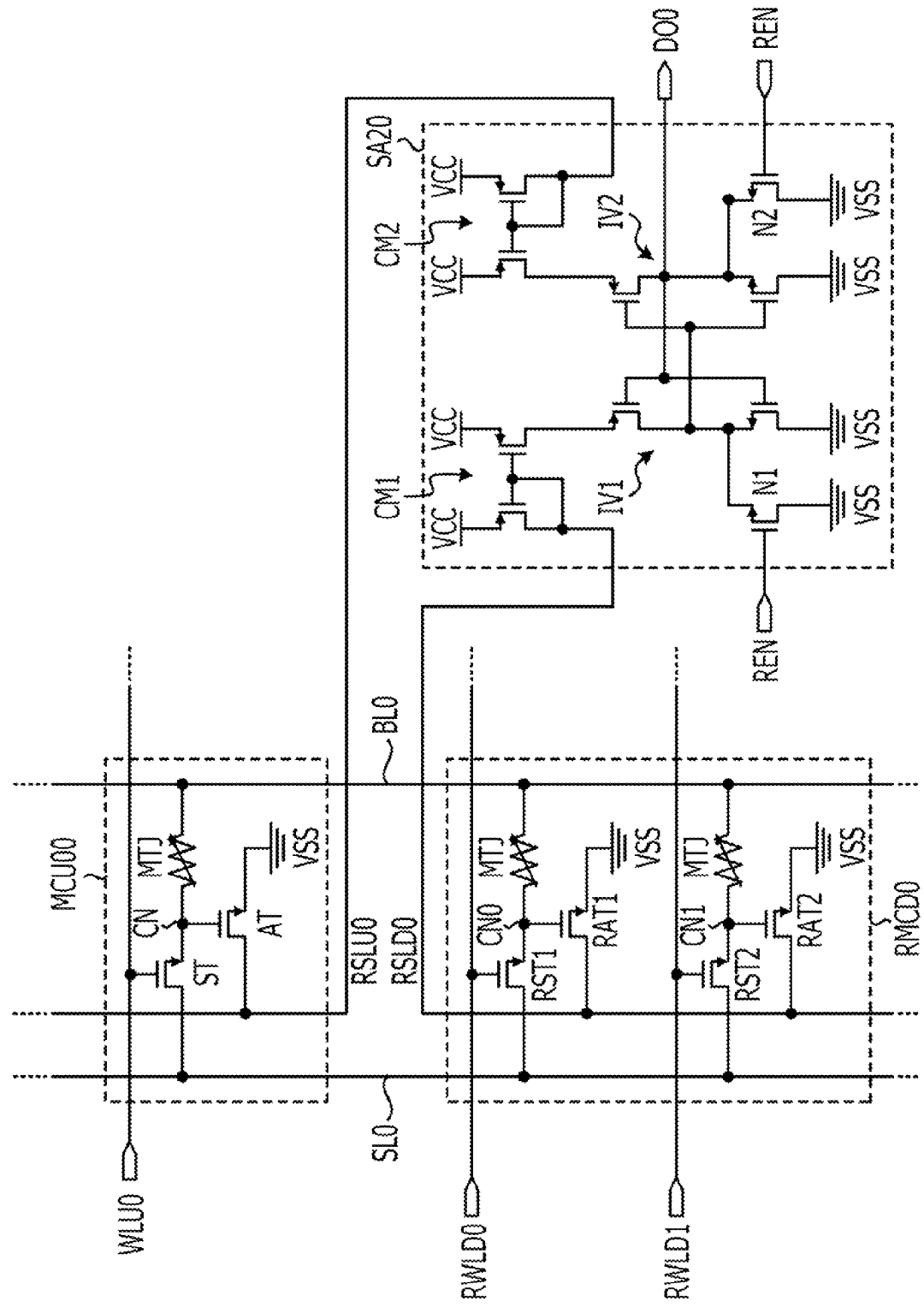
FIG. 11 is a diagram illustrating an exemplary sense amplifier of a fourth embodiment.

FIG. 11 is a diagram illustrating an exemplary sense amplifier SA20 of a fourth embodiment. The same structural components as those of the above second embodiment are designated by the same reference numerals and their detailed descriptions will be hereinafter omitted. The semiconductor memory MEM of fourth embodiment includes a sense amplifier SA20 instead of the sense amplifier SA (SA0, SA1, . . . , SAm) illustrated in FIG. 2. The structural components of the semiconductor memory MEM other than the sense amplifier SA20 are the same as those illustrated in FIG. 2. In other words, the semiconductor memory MEM is MRAM, RRAM, or ReRAM, which includes a MTJ element.

The sense amplifier SA20 includes current mirror circuits CM1 and CM2 that receive a pair of currents instead of the pMOS transistor P1 of the sense amplifier SA illustrated in FIG. 4. In the current mirror circuit CM1, the common gate node, which is one of paired differential inputs, is connected to the reference read line RSLD0. The current output node is connected to the source of the pMOS transistor of the CMOS inverter IV1. In the current mirror circuit CM2, the common gate node, which is one of paired differential inputs, is connected to the real read line RSLU0. The current output node is connected to the source of the pMOS transistor of the CMOS inverter IV2.

In addition, the gate of each of the nMOS transistors N1 and N2 receives a read enable signal REN. In the read operation, the read enable signal REN is activated to a high-level when operating the sense amplifier SA20. Furthermore, the sense amplifier is the same as the sense amplifier to be connected to other real read lines RSLU1-m and reference read lines RSLD1-m as illustrated in FIG. 11.

In fourth embodiment, the current mirror circuit CM1 supplies current equal to the current flowing into the ground line VSS from the reference read line RSLD0 through the reference amplification transistors RAT1 and RAT2 to the CMOS inverter IV1. The current mirror circuit CM2 supplies current equal to the current flowing into the ground line VSS from the real read line RSLU0 through the real amplification transistor AT to the CMOS inverter IV2. For example, the real memory cell MCU00 holds logic 1 (high resistance state). When the source/drain resistance of the real amplification transistor AT is low, the current value of the current mirror circuit CM2 becomes larger than the current value of the current mirror circuit CM1. Thus, the sense amplifier SA20 outputs a high-level data signal DO0.

On the other hand, the real memory cell MCU00 holds logic 0 (low resistance state). When the on-resistance of the real amplification transistor AT is high, the current value of the current mirror circuit CM2 becomes smaller than the current value of the current mirror circuit CM1. Thus, the sense amplifier SA20 outputs a low-level data signal DO0. As described above, in the fourth embodiment, the same effects as those of the second embodiment can be obtained in the semiconductor memory MEM having a current-input type sense amplifier SA20.

Fifth Embodiment

Figure 12:
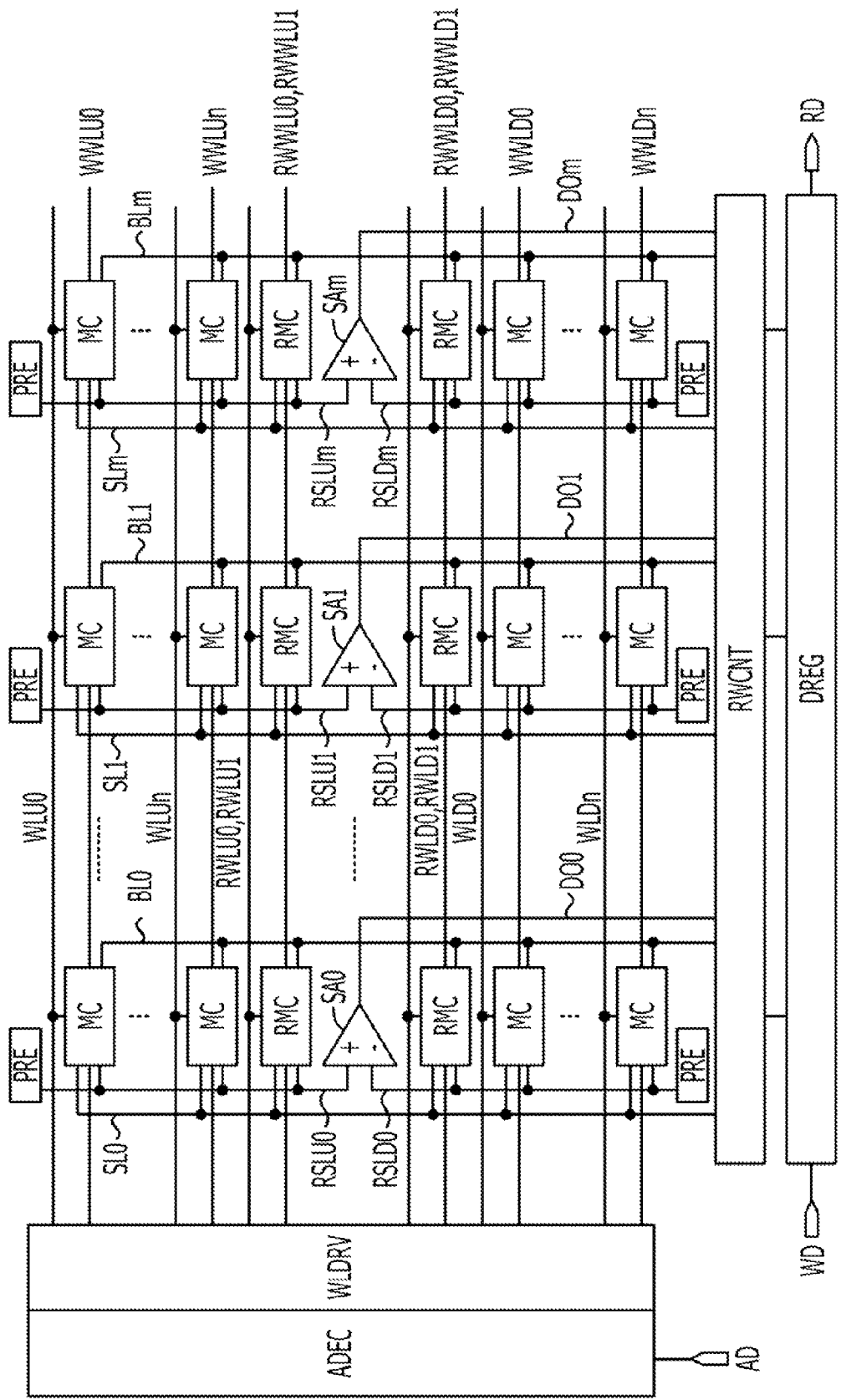
FIG. 12 is a diagram illustrating an exemplary semiconductor memory of a fifth embodiment.

FIG. 12 is a diagram illustrating a semiconductor memory of a fifth embodiment. The same structural components as those of the above embodiments are designated by the same reference numerals and their detailed descriptions will be hereinafter omitted. The semiconductor memory MEM of the fifth embodiment is a current induced magnetic field MRAM. Thus, the semiconductor memory MEM illustrated in FIG. 2 is further provided with real write word lines WWL (WWLU0, . . . , WWLUn, WWLD0, . . . , WWLDn) and reference write word lines RWWL (RWWLU0, RWWLU1, RWWLD0, RWWLD1).

The real write word line WWL and the reference write word line RWWL are driven by a word line driver WLDRV. Each real write word line WWL is connected to real memory cells MC arranged in the transverse direction of FIG. 12. Each reference write word line RWWL is connected to reference memory cells RMC arranged in the transverse direction of FIG. 12. Other structural components of the semiconductor memory MEM are the same as those illustrated in FIG. 2.

Figure 13:
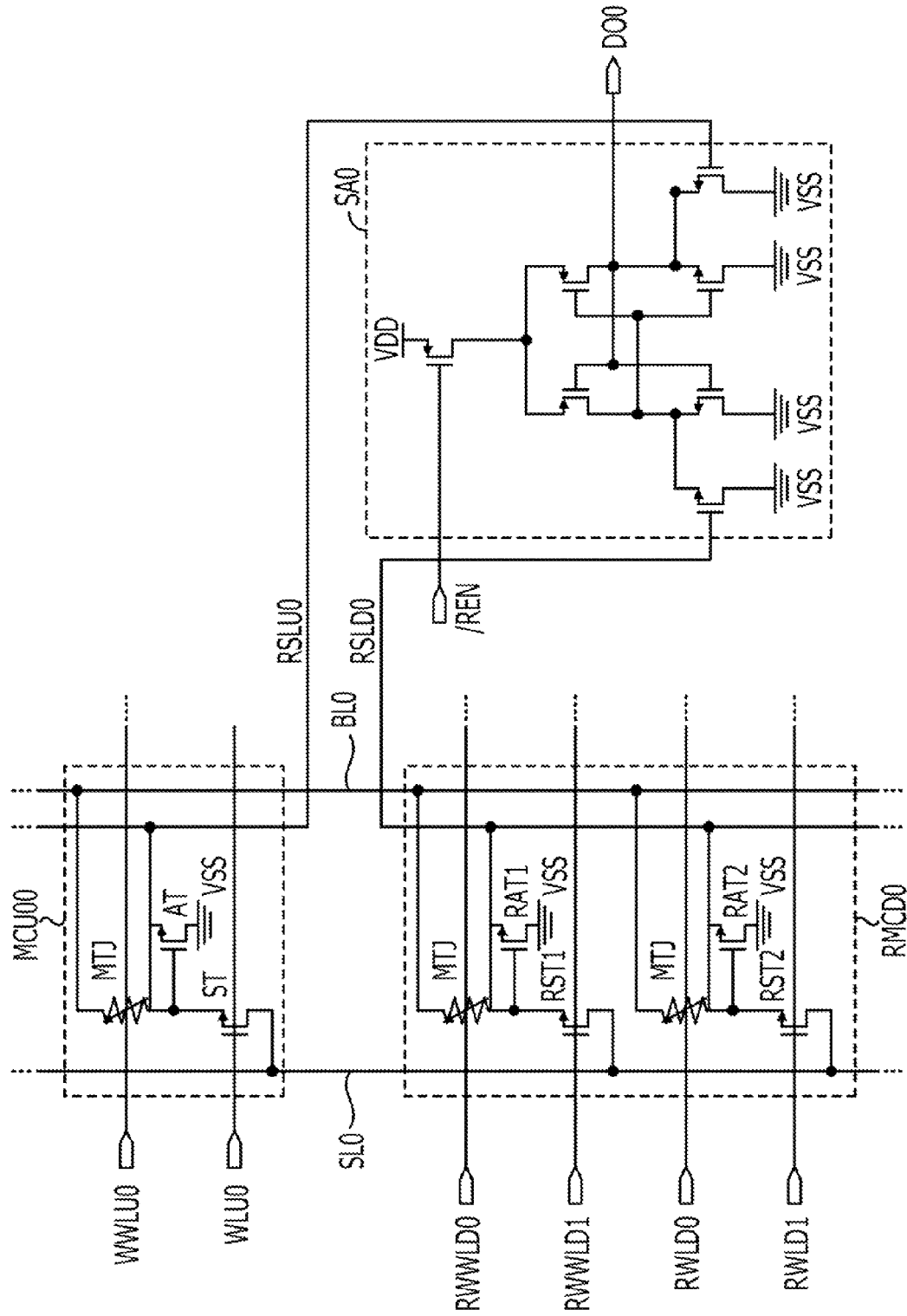
FIG. 13 is a diagram illustrating an exemplary real memory cell and an exemplary reference memory cell illustrated in FIG. 12.

FIG. 13 is a diagram illustrating an exemplary real memory cell MC and an exemplary reference memory cell RMC illustrated in FIG. 12. This example illustrates a real memory cell MCU00 connected to the real word line WLU0 and a reference memory cell RMCD0 connected to the reference word lines RWLD0-1. Other real memory cells MC and reference memory cells RMC are also the same circuit configurations as those illustrated in FIG. 13.

The real write word line WWLU0 is wired in the intersection direction of the bit line BL0 and passes above or below the MTJ element of the real memory cell MCU00. The real write word line WWLU0 is wired in the intersection direction of the bit line BL0 and passes above or below the MTJ element top of the real memory cell MCU00. In the actual element structure, an MTJ element is sandwiched between the write word line WWL (or RWWL) and the bit line BL0, and is arranged at the crossover portion between the write word line WWL (or RWWL) and the bit line BL0.

In the write operation of the current induced magnetic field MRAM, a magnetic field is generated by flowing a write current into each of the write word line WWLU0 and the bit line BL0 to change the resistance value of the MTJ element in the memory cell MCU00. The read operation of the memory cell MCU00 is the same as that of FIG. 7 and FIG. 8 except for setting the write word lines WWLU0, RWWLD0, and RWWLD1 to a low level. As described above, in the fifth embodiment, the same effects as those of the embodiment mentioned above can be acquired also in current induced magnetic field MRAM.

Sixth Embodiment

Figure 14:
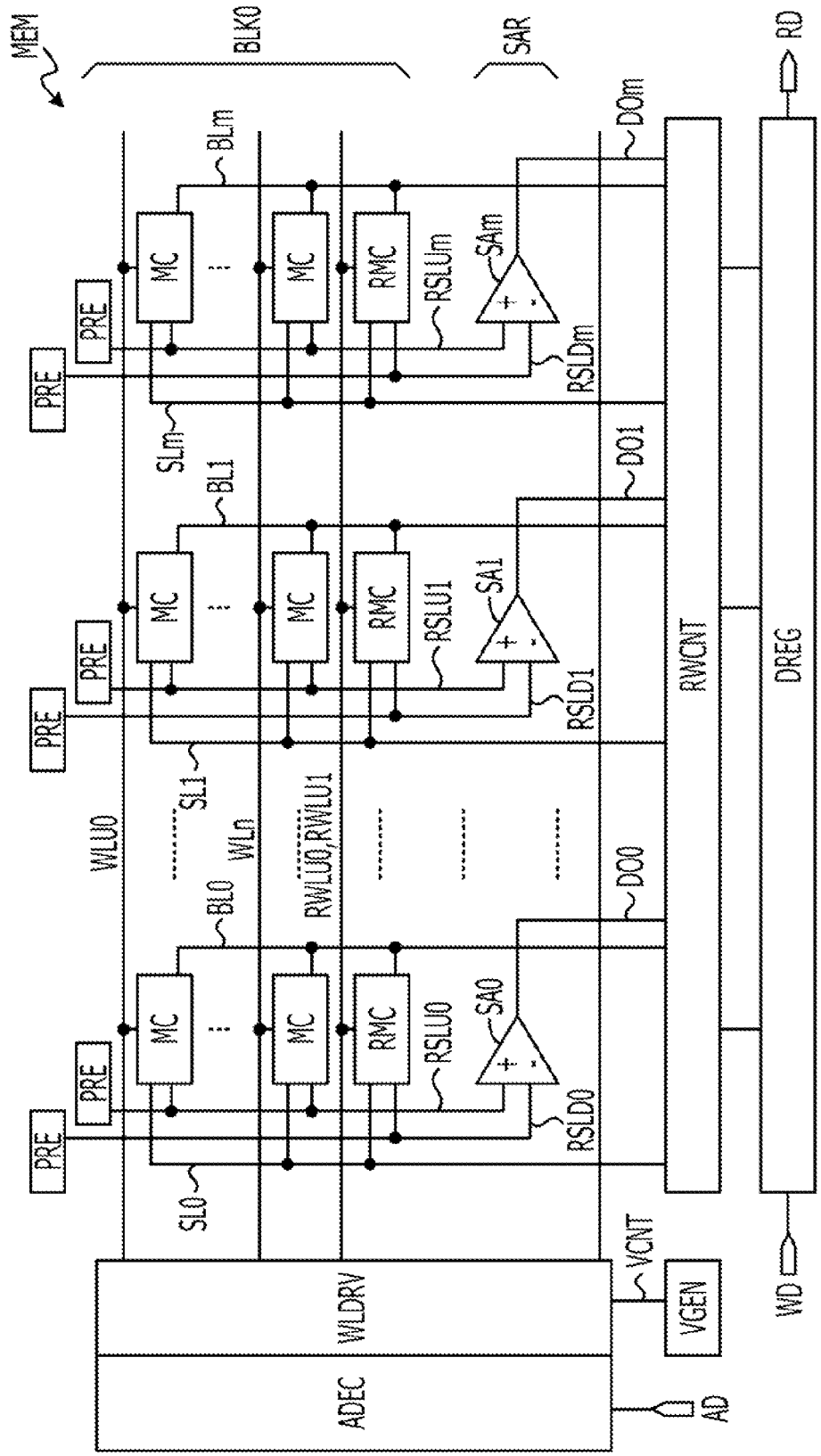
FIG. 14 is a diagram illustrating an exemplary semiconductor memory of a sixth embodiment.

FIG. 14 is a diagram illustrating a semiconductor memory of a sixth embodiment. The same structural components as those of the above embodiments are designated by the same reference numerals and their detailed descriptions will be hereinafter omitted. The semiconductor memory MEM of the sixth embodiment includes one memory block BLK0. The memory block BLK1 illustrated in FIG. 2 is not formed.

The memory BLK0 is additionally provided with reference read lines RSLD (RSLD0, RSLD1, . . . , RSLDm) and a pre-charge circuit PRE for the reference read line RSLD in addition to the configuration of the memory block BLK0 illustrated in FIG. 2. In addition, the reference memory cell RMC of the memory block BLK0 is connected to reference word lines RWLD0-RWLD1 instead of the reference word lines RWLU0-RWLU1. Other structural components of the memory block BLK0 is the same as the block memory cell BLK0 illustrated in FIG. 2.

An address decoder ADEC decodes an address signal AD for accessing the block BLK0, generates a decoded signal, and outputs the decoded signal to the word line driver WLDRV. In the write operation, the word line driver WLDRV activates any of real word lines WLU to a high level in response to the decoded signal. In the read operation, the word line driver WLDRV activates any of real word lines WLU and paired reference words RWLD0-1 to a high level in response to the decoded signal.

The voltage-generating section VGEN, R/W control section RWCNT, and data register DREG are the same as the voltage-generating section VGEN, R/W control section RWCNT, and data register DREG illustrated in FIG. 2, respectively. The write operation and read operation of the semiconductor memory MEM of this embodiment are the same as those illustrated in FIG. 5 to FIG. 8, except that real word lines WLD0-WLDn and reference word lines RWLU0-RWLU1 are not installed. As described above, in the sixth embodiment, the same effects as those of the above embodiments may be obtained.

Seventh Embodiment

Figure 15:
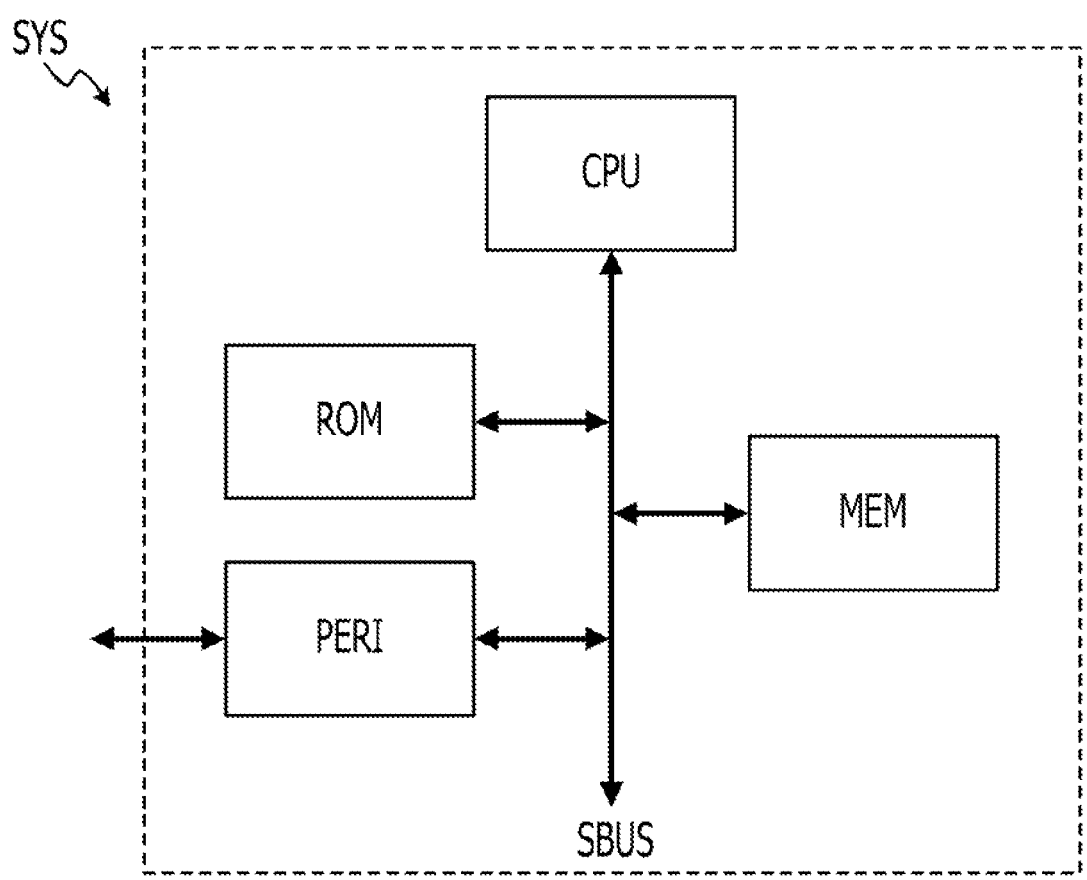
FIG. 15 is a diagram illustrating an exemplary system of a seventh embodiment.

FIG. 15 is a diagram illustrating a system SYS on which the above semiconductor memory MEM is mounted. For example, the system SYS includes at least part of a microcomputer system, such as a portable device. The configuration of the system SYS may be a system-on-chip SoC in which a plurality of macros is accumulated on a silicon substrate or a system-in-package SiP in which a plurality of chips is mounted on a package substrate.

For example, the system SYS includes a CPU, a ROM, a peripheral circuit, and any of the above semiconductor memories MEM. The CPU, ROM, peripheral circuit PERI, and semiconductor memory MEM are connected to one another through a system bus SBUS. The ROM stores a program to be executed by the CPU. The CPU accesses the semiconductor memory MEM as well as the CPU to control the operation of the entire system. Here, when the program to be executed by the CPU is stored in the semiconductor memory, the ROM is not required. The peripheral circuit PERI controls at least one of an input device and an output device, which are connected to the system SYS. The semiconductor memory MEM executes write operation and read operation in response to an access request from the CPU.

In the read operation, the source/drain resistance of the selection transistor may be set to a desired value by supplying a read control voltage to the gate of the selection transistor. Thus, the voltage of the connection node may be generated in high accuracy. As a result, in response to the logic of data held in the real memory cell, the real amplification transistor may be effectively and/or surely turned on or off. Thus, the data may be read without fault.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A semiconductor memory, comprising:
  a memory cell including a selection transistor and a resistance variable element which are connected in series between a first voltage line and a second voltage line through a connection node, and an amplification transistor having a gate connected to the connection node, a source connected to a reference voltage line, and a drain connected to a read line;

a sense amplifier to determine a logic held in the memory cell by receiving a voltage of the read line varied with a voltage generated in the connection node by resistance dividing between a source/drain resistance of the selection transistor and the resistance variable element, the selection transistor receiving a read control voltage at the gate thereof;

a control circuit to set a word line connected to the gate of the selection transistor to the read control voltage in a read operation, set the first voltage line to a high-level voltage, and set the second voltage line to a low-level voltage; and a pre-charge circuit to temporally supply a pre-charge voltage to the read line before the word line is set to the read control voltage in the read operation.

2. The semiconductor memory according to claim 1, wherein
the control circuit sets the voltage of the word line in a read operation to not be higher than the voltage of the word line in a write operation.

3. The semiconductor memory according to claim 1, wherein
the pre-charge circuit sets the voltage of the read line to be equal to the reference voltage line in a write operation.

4. The semiconductor memory according to claim 1, further comprising:
a reference memory cell connected to the first voltage line and the second voltage line, wherein
the reference memory cell includes:
a first selection transistor and a first resistance variable element having a resistance value set to a low-resistance state, which are connected in series between a first voltage line and a second voltage line through a first connection node;
a first amplification transistor having a gate connected to the first connection node, a source connected to the reference voltage line, and a drain connected to a reference read line, where a gate width is formed so that the gate size is the half of the amplification transistor;
a second selection transistor and a second resistance variable element having a resistance value set to a high-resistance state, which are connected in series between the first voltage line and the second voltage line through a second connection node;
a second amplification transistor having a gate connected to the second connection node, a source connected to the reference voltage line, and a drain connected to a reference read line, where a gate width is formed so that the gate size is the half of the amplification transistor, wherein
the sense amplifier includes a differential input pair connected to the read line and the reference read line, and determines logic held in the memory cell in response to the voltage of the read line and the voltage of the reference read light, which are changed in a read operation.

5. The semiconductor memory according to claim 4, further comprising:
a control circuit to set, in a read operation, a word line connected to the gate of the selection transistor, a first reference word line connected to the gate of the first selection transistor, and second reference word line connected to the gate of the second transistor to the read control voltage, set the first voltage line to a high level voltage, and set the second voltage line to a low level voltage; and a pre-charge circuit to temporally supply a pre-charge voltage to the read line and the reference read line before the word line and the first and second reference word line are set to the read control voltage.

6. The semiconductor memory according to claim 4, wherein
the sense amplifier includes a first current mirror circuit connected to the read line and a second current mirror circuit connected to the reference read line, wherein a current pair output from the first current mirror circuit and the second current mirror circuit is received by the differential input pair.

7. The semiconductor memory according to claim 4, further comprising:
a first memory block and a second memory block, each including the memory cell and the reference memory cell,
wherein
in the first memory block, the read line connected to the memory cell and the reference read line connected to the reference memory cell are connected to a first read line, and
in the second memory block, the read line connected to the memory cell and the reference read line connected to the reference memory cell are connected to a second read line, wherein
the differential input pair of the sense amplifier is connected to the first read line and the second read line.

8. The semiconductor memory according to claim 1, further comprising:
a plurality of memory blocks each including the memory cell, the sense amplifier, the control circuit, and the pre-charge circuit; and
a voltage-generating section to generate the read control voltage, which is formed corresponding to each of the memory blocks.

9. The semiconductor memory according to claim 1, wherein
the resistance variable element of the memory cell is a magnetic tunnel junction element formed on a magnetic random access memory (MRAM).

10. The semiconductor memory according to claim 9, further comprising:
a write word line arranged adjacent to the magnetic tunnel junction element, where the write word line intersects the second voltage line.

11. The semiconductor memory according to claim 1, wherein
the resistance variable element of the memory cell is a resistance variable element formed in a phase change random access memory (PRAM).

12. The semiconductor memory according to claim 1, wherein
the resistance variable element of the memory cell is a resistance variable element formed in resistive random a access memory (ReRAM).

13. A system, comprising:
a semiconductor memory including,
a selection transistor and a resistance variable element which are connected in series between a first voltage line and a second voltage line through a connection node;

a amplification transistor having a gate connected to the connection node, a source connected to a reference voltage line, and a drain connected to a read line;

a sense amplifier to determine a logic held in the memory cell by receiving a voltage of the read line varied with a voltage generated in the connection node by resistance dividing between a source/drain resistance of the selection transistor and the resistance variable element, the selection transistor receiving a read control voltage at the gate thereof;

a controller to control access to the semiconductor memory;

a control circuit to set a word line connected to the gate of the selection transistor to the read control voltage in a read operation, set the first voltage line to a high-level voltage, and set the second voltage line to a low-level voltage; and a pre-charge circuit to temporally supply a pre-charge voltage to the read line before the word line is set to the read control voltage in the read operation.

14. A system, comprising:

a semiconductor memory including,
- a selection transistor and a resistance variable element which are connected in series between a first voltage line and a second voltage line through a connection node;
- a amplification transistor having a gate connected to the connection node, a source connected to a reference voltage line, and a drain connected to a read line;
- a sense amplifier to determine a logic held in the memory cell by receiving a voltage of the read line varied with a voltage generated in the connection node by resistance dividing between a source/drain resistance of the selection transistor and the resistance variable element, the selection transistor receiving a read control voltage at the gate thereof;
- a controller to control access to the semiconductor memory;
- a reference memory cell connected to the first voltage line and the second voltage line, wherein the reference memory cell includes,
    - a first selection transistor and a first resistance variable element having a resistance value set to a low-resistance state, which are connected in series between a first voltage line and a second voltage line through a first connection node;
    - a first amplification transistor having a gate connected to the first connection node, a source connected to the reference voltage line, and a drain connected to a reference read line, where a gate width is formed so that the gate size is the half of the amplification transistor;
    - a second selection transistor and a second resistance variable element having a resistance value set to a high-resistance state, which are connected in series between the first voltage line and the second voltage line through a second connection node;
    - a second amplification transistor having a gate connected to the second connection node, a source connected to the reference voltage line, and a drain connected to a reference read line, where a gate width is formed so that the gate size is the half of the amplification transistor, wherein the sense amplifier includes a differential input pair connected to the read line and the reference read line, and determines logic held in the memory cell in response to the voltage of the read line and the voltage of the reference read light, which are changed in a read operation.

15. The system according to claim 14, wherein
the semiconductor memory further includes:
a word line connected to the gate of the selection transistor, a first reference word line connected to the gate of the first selection transistor, and second reference word line connected to the gate of the second transistor to the read control voltage, the first voltage line is set to a high level voltage, and the second voltage line is set to a low level voltage;
a pre-charge circuit to temporally supply a pre-charge voltage to the read line and the reference read line before the word line and the first and second reference word line are set to the read control voltage.

16. The system according to claim 14, wherein
the sense amplifier includes a first current mirror circuit connected to the read line and a second current mirror circuit connected to the reference read line, wherein
a current pair output from the first current mirror circuit and the second current mirror circuit is received by the differential input pair.

17. The system according to claim 14, wherein
the semiconductor memory further includes:
a first memory block and a second memory block, each including the memory cell and the reference memory cell, wherein
in the first memory block, the read line connected to the memory cell and the reference read line connected to the reference memory cell are connected to a first read line,
in the second memory block, the read line connected to the memory cell and the reference read line connected to the reference memory cell are connected to a first read line, and
the differential input pair of the sense amplifier is connected to the first read line and the second read line.

18. The system according to claim 13, wherein
the semiconductor memory further includes:
a plurality of memory blocks each including the memory cell, the sense amplifier, the control circuit, and the pre-charge circuit; and
a voltage-generating section to generate the read control voltage, which is formed corresponding to each of the memory blocks.

* * * * *